United States Patent
Choi

(10) Patent No.: US 9,998,121 B2
(45) Date of Patent: Jun. 12, 2018

(54) OUTPUT BUFFER CIRCUIT AND MEMORY DEVICE INCLUDING THE SAME

(71) Applicant: Samsung Electronics Co., Ltd., Suwon-si (KR)

(72) Inventor: Hun-Dae Choi, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/688,532

(22) Filed: Aug. 28, 2017

(65) Prior Publication Data

US 2018/0123593 A1 May 3, 2018

(30) Foreign Application Priority Data

Nov. 2, 2016 (KR) .................. 10-2016-0145378

(51) Int. Cl.
*H03K 19/018* (2006.01)
*G11C 7/10* (2006.01)
(Continued)

(52) U.S. Cl.
CPC ... *H03K 19/018564* (2013.01); *G11C 7/1051* (2013.01); *G11C 29/022* (2013.01);
(Continued)

(58) Field of Classification Search
CPC ............. H03K 19/0005; H03K 19/094; H03K 19/018521; H03K 17/687;
(Continued)

(56) References Cited

U.S. PATENT DOCUMENTS 7,391,238 B2   6/2008  Kim et al.
7,853,842 B2 * 12/2010  Kim .................... G11C 5/063
                                          324/601
(Continued)

FOREIGN PATENT DOCUMENTS

KR       2006-0117170 A     11/2006
KR       20070089387 A       8/2007
(Continued)

*Primary Examiner* — Vibol Tan
(74) *Attorney, Agent, or Firm* — Muir Patent Law, PLLC

(57) ABSTRACT

An output buffer circuit may include a pulse generator, a transmitter, and an emphasis controller. The pulse generator generates a pulse signal for determining an emphasis execution period. The transmitter may receive an input data and to have a first output resistance value, which is determined by the input data and a resistance calibration code, and to have a second output resistance value different from the first output resistance value, which is determined by the input data and an emphasis code different from the resistance calibration code for executing an emphasis operation during the emphasis execution period, based on the pulse signal. The emphasis controller provides the resistance calibration code or the emphasis code to the transmitter based on the pulse signal. The emphasis code may include a first code determined by the input data regardless of the resistance calibration code.

20 Claims, 19 Drawing Sheets

(51) Int. Cl.
  *G11C 29/02* (2006.01)
  *H03K 19/0185* (2006.01)
  *H03K 3/012* (2006.01)
  *H03K 17/16* (2006.01)
  *H03K 19/094* (2006.01)

(52) U.S. Cl.
  CPC ............. *H03K 3/012* (2013.01); *H03K 17/16* (2013.01); *H03K 19/018521* (2013.01); *H03K 19/018585* (2013.01); *H03K 19/094* (2013.01)

(58) Field of Classification Search
  CPC ..... H03K 19/00384; H03K 19/017545; H03K 19/018585; H03K 19/018564; H04L 25/0278; H04L 25/0264; H04L 25/0298; G11C 29/50008; G11C 2207/2254; G11C 29/028; G11C 5/04; G11C 7/1051; G11C 11/4096; G11C 29/022; H03H 11/28
  See application file for complete search history.

(56) References Cited

U.S. PATENT DOCUMENTS

| | | | |
|---|---|---|---|
| 7,863,936 B1 | 1/2011 | Liu et al. | |
| 7,902,858 B2 | 3/2011 | Kuwahara et al. | |
| 7,911,225 B2 * | 3/2011 | Ahn | G11C 7/1051 326/30 |
| 7,991,573 B2 | 8/2011 | Homer et al. | |
| 8,125,241 B2 * | 2/2012 | Fratti | H04L 25/0288 326/30 |
| 8,416,634 B2 * | 4/2013 | Kim | G11C 7/1051 365/189.07 |
| 8,817,864 B2 * | 8/2014 | Kobayashi | H04B 3/04 370/208 |
| 8,848,826 B2 * | 9/2014 | Lin | H04L 25/0264 326/21 |
| 8,878,564 B2 * | 11/2014 | Araki | H03K 19/00369 324/108 |
| 8,896,353 B2 * | 11/2014 | Hafizi | H03K 17/06 326/82 |
| 8,947,133 B2 | 2/2015 | Shih | |
| 9,106,219 B2 * | 8/2015 | Singh | H04L 25/0278 |
| 9,118,313 B2 * | 8/2015 | Lee | H03K 19/0005 |
| 9,337,807 B2 | 5/2016 | Hollis et al. | |
| 9,369,128 B1 * | 6/2016 | Tan | H03K 19/0005 |
| 9,391,594 B2 * | 7/2016 | Jung | H03K 3/012 |
| 9,721,588 B2 * | 8/2017 | Windler | G11B 5/09 |
| 9,722,582 B2 * | 8/2017 | Jung | H03K 3/012 |
| 9,748,956 B2 * | 8/2017 | Lee | H03K 19/017545 |
| 9,825,631 B1 * | 11/2017 | Cho | H03K 19/0005 |
| 2007/0200592 A1 | 8/2007 | Kim et al. | |
| 2012/0113732 A1 | 5/2012 | Sohn et al. | |
| 2017/0366183 A1 * | 12/2017 | Jung | H03K 19/0005 |

FOREIGN PATENT DOCUMENTS

| | | |
|---|---|---|
| KR | 20110107995 A | 10/2011 |
| KR | 20120047385 A | 5/2012 |
| KR | 20120049735 A | 5/2012 |

* cited by examiner

OUTPUT BUFFER CIRCUIT AND MEMORY DEVICE INCLUDING THE SAME

CROSS-REFERENCE TO RELATED APPLICATIONS

This U.S. non-provisional patent application claims priority under 35 U.S.C. § 119 to Korean Patent Application No. 10-2016-0145378 filed Nov. 2, 2016, in the Korean Intellectual Property Office, the entire contents of which are hereby incorporated by reference.

BACKGROUND

Exemplary embodiments relate to a semiconductor circuit, and more particularly, to an output buffer circuit performing an emphasis operation and a memory device including the same.

Memory devices are being used as a voice and image data storage medium of information devices such as a computer, a cellular phone, a smartphone, a personal digital assistant (PDA), a digital camera, a camcorder, a voice recorder, an MP3 player, a handheld PC, a game console, a facsimile, a scanner, and a printer. The consumer's demand for memory devices diversifies as the memory devices are used as a storage medium in various devices.

Accordingly, technologies for high-capacity, high-speed, and low-power memory devices are being developed. As the throughput of devices that support various functions increases, high-capacity and high-speed memory devices are growing rapidly. Various memory devices may be integrated in one memory system to implement high-capacity memory devices. In this case, the load of an output buffer circuit of each memory device increases, thus making the quality of output data worse.

Also, since a memory device operates at a very fast speed, higher signal quality and stability are desirable. If the memory device outputs data at a high speed, inter symbol interference (ISI) becomes worse, thus causing a decrease in signal quality. The ISI refers to distortion of a waveform of output data due to interference between codes of adjacent data. Accordingly, technologies for preventing distortion of output data due to the ISI are helpful to improve the signal quality together with implementing high-capacity and high-speed memory devices.

SUMMARY

Exemplary embodiments provide an output buffer circuit that performs pre-emphasis or de-emphasis and a memory device including the same.

According to an aspect of an embodiment, an output buffer circuit may include a pulse generator, a transmitter, and an emphasis controller. The pulse generator may generate a pulse signal for determining an emphasis execution period. The transmitter may receive an input data and have a first output resistance value, which is determined by the input data and a resistance calibration code, and have a second output resistance value different from the first resistance value, which is determined by the input data and an emphasis code different from the resistance calibration code for executing an emphasis operation during the emphasis execution period, based on the pulse signal. The emphasis controller provides the resistance calibration code or the emphasis code to the transmitter based on the pulse signal. The emphasis code may include a first code determined by the input data regardless of the resistance calibration code.

According to another aspect of an embodiment, a memory device may include a memory cell array, a code generation circuit and an output buffer circuit. The memory cell array includes a plurality of memory cells. The code generation circuit generates a resistance calibration code for determining an output resistance value, and the output buffer circuit may include a main driver configured to output a data output signal based on an input data read from the memory cell array. The main driver may receive the resistance calibration code, provide a first output resistance value determined by the resistance calibration code upon the input data, and provide a second output resistance value determined by an emphasis code different from the resistance calibration code for performing an emphasis operation in an emphasis execution period upon the input data. The emphasis code may include a first code determined by the input data regardless of the resistance calibration code.

According to another aspect of an embodiment, a memory device may include a memory cell array, a termination resistance calibration circuit and an output buffer circuit. The memory cell array includes a plurality of memory cells. The termination resistance calibration circuit is configured to generate a resistance calibration code for determining an output resistance value. The output buffer circuit may include a pre-driver and a main driver, and is configured to receive an input data read from the memory cell array and output an output data. The pre-driver is configured to generate a first driving signal code in response to the input data regardless of the resistance calibration code, and to generate a second driving signal code in response to the input data and the resistance calibration code. The main driver is configured to output the output data to have a first output resistance value in response to the first driving signal code, and have a second output resistance value different from the first output resistance value in response to the second driving signal code. Each of the first and second driving signal codes may include a first signal code determined by the input data regardless of the resistance calibration code.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
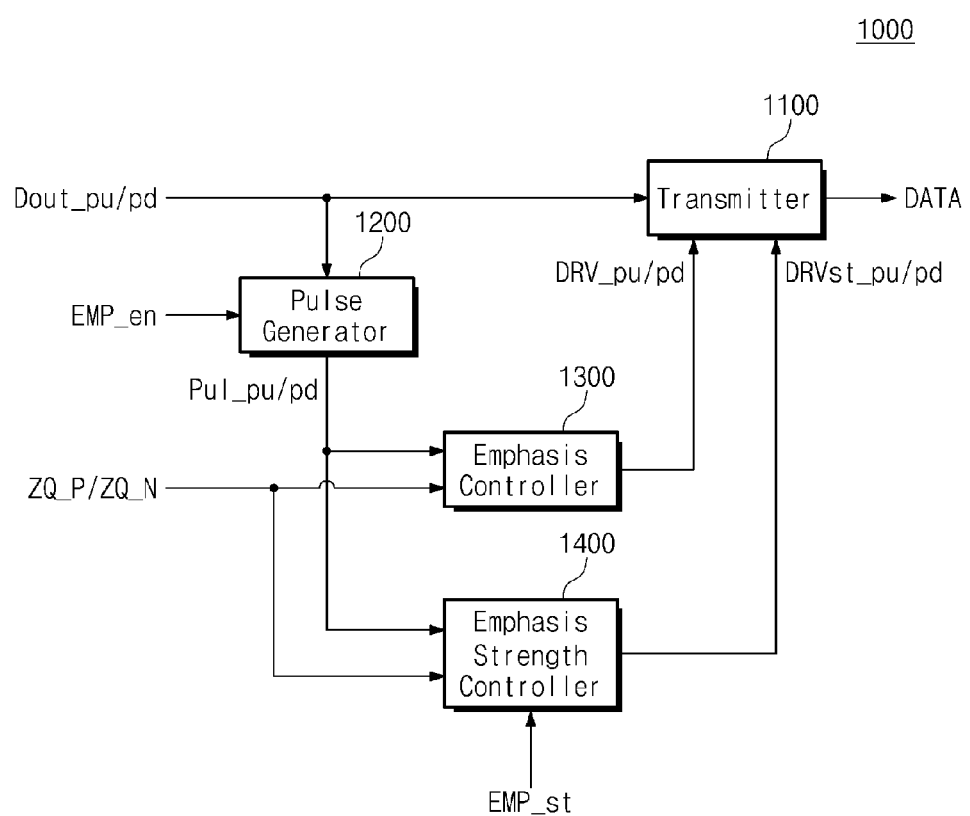
FIG. 1 is a block diagram illustrating an output buffer circuit, according to example embodiments.

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated.

FIG. 1 is a block diagram illustrating an output buffer circuit, according to example embodiments. Referring to FIG. 1, an output buffer circuit 1000 may include a transmitter 1100, a pulse generator 1200, an emphasis controller 1300, and an emphasis strength controller 1400. The output buffer circuit 1000 may perform an emphasis operation (e.g., a pre-emphasis operation or a de-emphasis operation) to improve the quality of a data signal DATA that is output from the output buffer circuit 1000. The output buffer circuit 1000 may also perform an output operation (e.g., a normal operation) to output the data signal DATA during a period of time after or before the emphasis operation. Hereinafter, the pre-emphasis operation may have occurred before the normal operation, and the de-emphasis operation may have occurred after the normal operation.

As an example, the output buffer circuit 1000 may output the data signal DATA through an input/output pad DQ.

In the case where the output buffer circuit 1000 transmits the data signal DATA to an external device through a channel (for example, shown in FIG. 11), intersymbol interference (ISI) may be generated between codes of adjacent data in the data signal DATA due to a limited bandwidth of the channel. By the ISI, a high-frequency component of the data signal DATA may be attenuated, and a waveform thereof may be distorted. The distortion of the data signal DATA makes it difficult or impossible to send desired data normally.

To compensate for the ISI of the data signal DATA, the output buffer circuit 1000 may perform an emphasis operation. The data signal DATA generated by the emphasis operation has a waveform in which a voltage level during a period where data transitions is higher than a voltage level during a period where the data is maintained. Below, the data waveform is referred to as an "emphasis waveform". It may be possible to reduce the ISI of the data signal DATA due to the limited channel bandwidth by using the emphasis waveform.

A method of generating the emphasis waveform of the data signal DATA through the above-described emphasis operation may include a pre-emphasis method and a de-emphasis method.

In example embodiments, when the data signal DATA transitions to a logic high level "H", the pre-emphasis method is a method of generating an emphasis waveform that is configured such that a first voltage during a period where data transitions may be higher than a second voltage during a period where the data signal DATA is output in the normal operation. For example, in the normal operation, the second voltage corresponding to data is maintained at a predetermined voltage level. However, for the pre-emphasis method, the first voltage higher than the second voltage is generated followed by the second voltage.

In other example embodiments, when the data signal DATA transitions to a logic low level "L", the pre-emphasis method is a method of generating an emphasis waveform that is configured such that a third voltage during a period where data transitions may be lower than a fourth voltage during a period where the data signal DATA is output in the normal operation. For example, in the normal operation, the fourth voltage corresponding to data is maintained at a predetermined voltage level. However, for the pre-emphasis method, the third voltage lower than the fourth voltage is generated followed by the fourth voltage.

In contrast, in example embodiments, when the data signal DATA transitions to a logic high level "H", the de-emphasis method is a method of generating an emphasis waveform that is configured such that a voltage level during a period where data is maintained may be lower than an output voltage level of the data signal DATA in the normal operation. For example, in the de-emphasis operation, the voltage level of the data signal DATA maintains at a predetermined voltage level.

In other example embodiments, when the data signal DATA transitions to a logic low level "L", the de-emphasis method is a method of generating an emphasis waveform that is configured such that a voltage level during a period where data is maintained may be higher than an output voltage level of the data signal DATA in the normal operation. For example, in the de-emphasis operation, the voltage level of the data signal DATA maintains at a predetermined voltage level.

According to an embodiment of the inventive concept, the output buffer circuit 1000 may perform the above-described pre-emphasis method and de-emphasis method. A part of a circuit included in the transmitter 1100 may change with the emphasis method.

Figure 11:
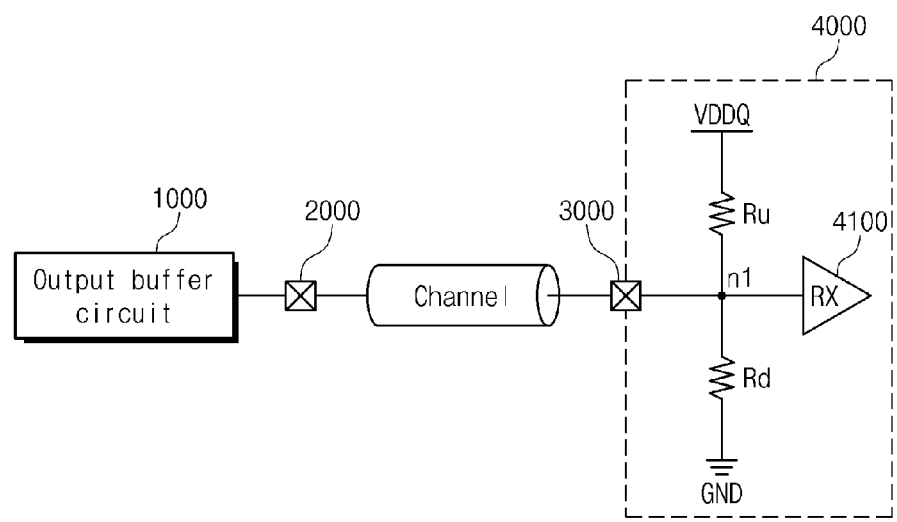
FIGS. 11 and 12 are a block diagram and a timing diagram for describing a pre-emphasis operation of an output buffer circuit of FIG. 1 according to example embodiments.

The transmitter 1100 generates the data signal DATA based on pull up and pull down data Dout_pu and Dout_pd through an internal circuit (not illustrated) and transmits the data signal DATA to a channel (for example, shown in FIG. 11). The pull up and pull down data Dout_pu and Dout_pd may be referred to as an input data of the transmitter 1100. As an example, the pull up and pull down data Dout_pu and Dout_pd may be generated based on data read from a memory cell array (for example, shown in FIG. 18). As an example, when a memory cell of the memory cell array stores data "H", the pull up and pull down data Dout_pu and Dout_pd may be "H" and when a memory cell of the memory cell array stores data "L", the pull up and pull down data Dout_pu and Dout_pd may be "L". When the transmitter 1100 transmits the data signal DATA to the channel, the transmitter 1100 adjusts an output resistance value such that an output resistance value and an impedance of the channel may be matched, thus reducing reflection of the data signal DATA and preventing a decrease in the quality of the data signal DATA. The transmitter 1100 may be provided with pull up and pull down resistance calibration codes ZQ_P and ZQ_N for impedance matching with the channel from a termination resistance calibration circuit (for example, shown in FIG. 18) through the emphasis controller 1300 and the emphasis strength controller 1400. In general, when a calibration operation of the memory device ends, a resistance of an output driver of the memory device and an external resistance Rext of the channel may be matched. The termination resistance calibration circuit may generate pull up and pull down resistance calibration codes ZQ_P and ZQ_N when the resistance of the output driver and the external resistance Rext are matched. The termination resistance calibration circuit may include a code generation circuit (not shown) that generates the pull up and pull down resistance calibration codes ZQ_P and ZQ_N.

When the transmitter 1100 outputs the data signal DATA, the transmitter 1100 may be provided with the pull up and pull down resistance calibration codes ZQ_P and ZQ_N through pull up and pull down pre-driving signals DRV_pu and DRV_pd and pull up and pull down auxiliary driving signals DRVst_pu and DRVst_pd. Also, in an emphasis execution period of the transmitter 1100, the transmitter 1100 may be provided with an emphasis code through the pull up and pull down pre-driving signals DRV_pu and DRV_pd and the pull up and pull down auxiliary driving signals DRVst_pu and DRVst_pd. For example, each of the pull up and pull down pre-driving signals DRV_pu and DRV_pd and pull up and pull down auxiliary driving signals DRVst_pu and DRVst_pd may have a plurality of codes.

The emphasis code is a code for determining an output resistance value that is used to generate the above-described emphasis waveform. Although not illustrated in FIG. 1, the emphasis code may include a pull up emphasis code and a pull down emphasis code. The pull up emphasis code corresponds to the maximum value or minimum value of the above-described pull up resistance calibration code ZQ_P. Also, the pull down emphasis code corresponds to the maximum value or minimum value of the above-described pull down resistance calibration code ZQ_N.

The pulse generator 1200 generates pull up and pull down pulses Pul_pu and Pul_pd for determining the emphasis execution period based on the pull up and pull down data Dout_pu and Dout_pd from the internal circuit. For example, the pulse generator 1200 may generate the pull up pulse Pul_pu having a high pulse and the pull down pulse Pul_pd having a low pulse. The pulse generator 1200 may perform or may not perform the emphasis operation in response to an emphasis control signal EMP_en. In example embodiments, the emphasis control signal EMP_en may be generated from a mode register (for example, shown in FIG. 18) or a test mode register (not shown). The emphasis control signal EMP_en may be activated for a predetermined period of time. A configuration and an operation of the pulse generator 1200 will be described with reference to FIGS. 8A and 8B.

On the basis of the pull up and pull down pulses Pul_pu and Pul_pd, the emphasis controller 1300 outputs inverted codes of the pull up and pull down resistance calibration codes ZQ_P and ZQ_N as the pull up and pull down pre-driving signals DRV_pu and DRV_pd or inverted codes of the pull up and pull down emphasis codes as the pull up and pull down pre-driving signals DRV_pu and DRV_pd.

The emphasis strength controller 1400 operates in a manner that is similar to that of the emphasis controller 1300. For example, compared with the emphasis controller 1300, the emphasis strength controller 1400 may be further provided with a strength adjustment signal EMP_st. In example embodiments, the strength adjustment signal EMP_st may be generated from the mode register or the test mode register. As an example, the strength adjustment signal EMP_st may be activated for a predetermined period of time. When the strength adjustment signal EMP_st is activated, based on the pull up and pull down pulses Pul_pu and Pul_pd, the emphasis strength controller 1400 outputs inverted codes of the pull up and pull down resistance calibration codes ZQ_P and ZQ_N as the pull up and pull down auxiliary driving signals DRVst_pu and DRVst_pd or inverted codes of the pull up and pull down emphasis codes as the pull up and pull down auxiliary driving signals DRVst_pu and DRVst_pd.

Alternatively, when the strength adjustment signal EMP_st is deactivated, the emphasis strength controller 1400 outputs inverted codes of the pull up and pull down resistance calibration codes ZQ_P and ZQ_N as the pull up and pull down auxiliary driving signals DRVst_pu and DRVst_pd regardless of the pull up and pull down pulses Pul_pu and Pul_pd. For example, the emphasis strength controller 1400 may adjust emphasis strength in response to the strength adjustment signal EMP_st when the transmitter 1100 performs the emphasis operation.

A configuration of the output buffer circuit 1000 that performs the emphasis operation is briefly described above. Through the above-described configurations, the output buffer circuit 1000 changes a resistance calibration code value from a predetermined value (i.e., determined after a termination resistance calibration operation) to be provided to a main driver (for example, shown in FIG. 2) included in the transmitter 1100 and performs the emphasis operation based on the changed resistance calibration code value. For example, since the output buffer circuit 1000 does not include the separate main driver for the emphasis operation, it may be possible to reduce a size of the output buffer circuit and prevent an increase in parasitic capacitance of an output terminal that is generated by the separate main driver. Accordingly, the output buffer circuit 1000 may minimize the parasitic capacitance and provide the emphasis function, thereby improving the quality of an output signal.

A configuration and an operating method of the output buffer circuit 1000 for pre-emphasis will be described with reference to FIGS. 2 to 7, 8A to 8C, and 9 to 12, and a configuration and an operating method of the output buffer circuit 1000 for de-emphasis will be described with reference to FIGS. 13 to 18.

Figure 2:
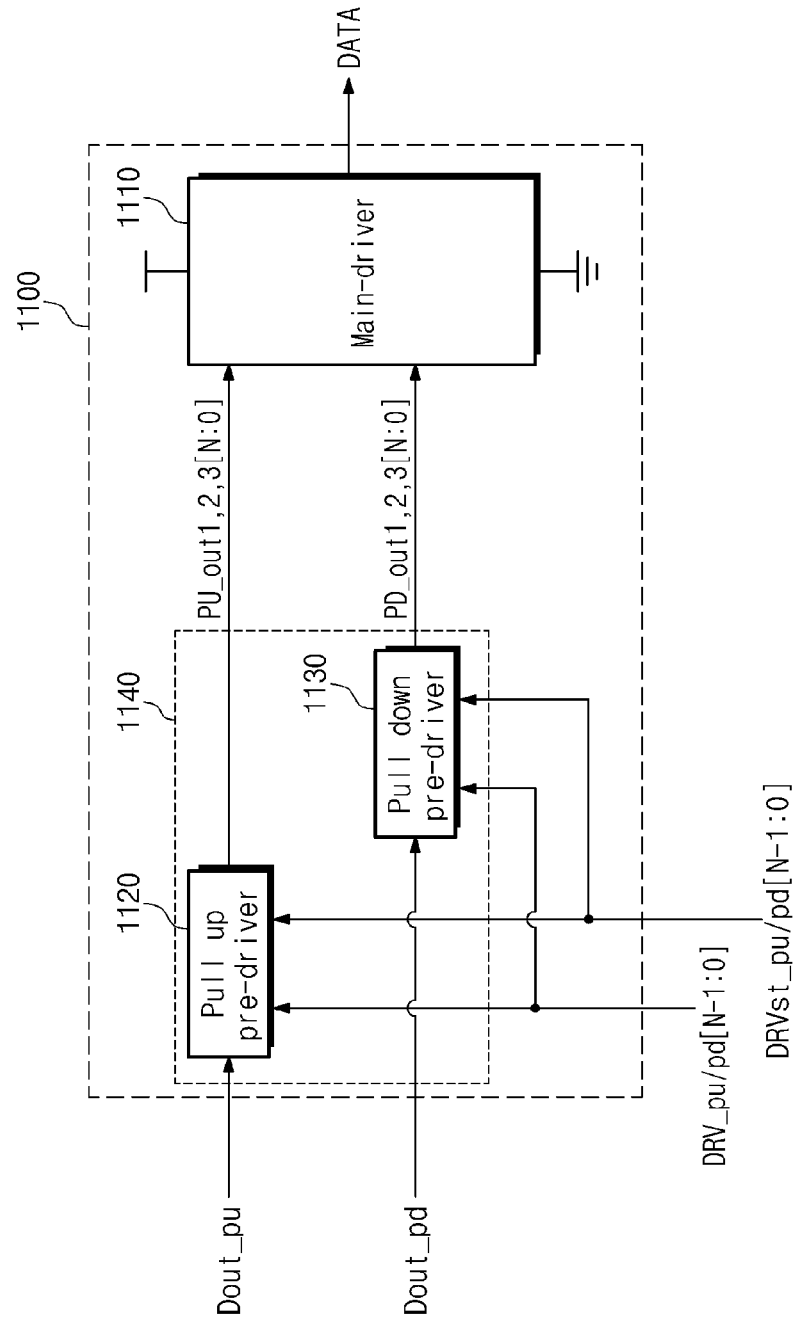
FIG. 2 is a block diagram illustrating a transmitter of FIG. 1 that performs a pre-emphasis operation, according to example embodiments.

FIG. 2 is a block diagram illustrating a transmitter of FIG. 1 that performs a pre-emphasis operation, according to example embodiments. FIG. 2 will be described with reference to FIG. 1. Referring to FIG. 2, the transmitter 1100 may include a main driver 1110 and a pre-driver 1140. The pre-driver 1140 may include a pull up pre-driver 1120 and a pull down pre-driver 1130. The transmitter 1100 generates the data signal DATA based on the pull up and pull down data Dout_pu and Dout_pd from the internal circuit and provides the data signal DATA to an external device (for example, shown in FIG. 11) through a pad (for example, shown in FIG. 11) and a channel (for example, shown in FIG. 11).

The main driver 1110 generates the output data signal DATA based on first to third pull up driving signals (or, first to third pull up driving signal codes) PU_out1[N:0], PU_out2[N:0], and PU_out3[N:0] from the pull up pre-driver 1120 and first to third pull down driving signals (or, first to third pull down driving signal codes) PD_out1[N:0], PD_out2[N:0], and PD_out3[N:0] from the pull down pre-driver 1130. To provide various output resistance values, the main driver 1110 may include a plurality of pull up units (for example, shown in FIG. 4) and a plurality of pull down units (not illustrated). As used herein, a "unit" may refer to a "circuit". The first to third pull up driving signals PU_out1[N:0], PU_out2[N:0], and PU_out3[N:0] are used to drive the pull up units of the main driver 1110, and the first to third pull down driving signals PD_out1[N:0], PD_out2[N:0], and PD_out3[N:0] are used to drive the pull down units thereof.

The main driver 1110 is connected with an external channel when sending data to the outside. Accordingly, to prevent a reflected wave by the channel, which is generated upon sending data, an output resistance value of the main driver 1110 may be set with a resistance value that is impedance matched with the channel. The main driver 1110 may include a plurality of transistors for impedance matching with the channel. The number "N" of bits of each of the first to third pull up driving signals PU_out1[N:0], PU_out2[N:0], and PU_out3[N:0] and the first to third pull down driving signals PD_out1[N:0], PD_out2[N:0], and PD_out3[N:0] is determined by the number of transistors included in the main driver 1110. A configuration of the main driver 1110 will be described with reference to FIG. 3.

The pull up pre-driver 1120 is provided with the pull up data Dout_pu from the internal circuit. For example, the pull up data Dout_pu may be generated based on data read from the memory cell array. Also, the pull up pre-driver 1120 is provided with the pull up pre-driving signals DRV_pu[N−1:0] from the emphasis controller 1300 and the pull up auxiliary driving signals DRVst_pu[N−1:0] from the emphasis strength controller 1400.

As described above, in the case where the pull up pre-driver 1120 is provided with an inverted code of the pull up resistance calibration code ZQ_P through the pull up pre-driving signals DRV_pu[N−1:0] and the pull up auxiliary driving signals DRVst_pu[N−1:0], the pull up pre-driver 1120 generates the first to third pull up driving signals PU_out1[N:0], PU_out2[N:0], and PU_out3[N:0] for driving the main driver 1110 such that an output resistance value corresponding to the pull up resistance calibration code ZQ_P is provided.

Alternatively, to perform a pre-emphasis operation, the pull up pre-driver 1120 is provided with an inverted emphasis code through the pull up pre-driving signals DRV_pu[N−1:0]. In addition, when the emphasis strength controller 1400 performs the emphasis operation in response to the strength adjustment signal EMP_st, the pull up pre-driver 1120 is provided with the inverted emphasis code through the pull up auxiliary driving signals DRVst_pu[N−1:0]. When the pull up pre-driver 1120 performs the pre-emphasis operation, the pull up pre-driver 1120 generates the first to third pull up driving signals PU_out1[N:0], PU_out2[N:0], and PU_out3[N:0] for driving the main driver 1110 such that an output resistance value corresponding to the provided inverted code of emphasis code is provided.

The pull down pre-driver 1130 is provided with the pull down data Dout_pd from the internal circuit. For example, the pull down data Dout_pd may be generated based on data read from the memory cell array. Also, the pull down pre-driver 1130 is provided with the pull down pre-driving signals DRV_pd[N−1:0] from the emphasis controller 1300 and the pull down auxiliary driving signals DRVst_pd[N−1:0] from the emphasis strength controller 1400.

The pull down pre-driver 1130 operates in a manner that is similar to that of the pull up pre-driver 1120. That is, the pull down pre-driver 1130 is provided with the inverted code of pull down resistance calibration code ZQ_N or the emphasis code through the pull down pre-driving signals DRV_pd[N−1:0] and the pull down auxiliary driving signals DRVst_pd[N−1:0]. The pull down pre-driver 1130 generates the first to third pull down driving signals PD_out1[N:0], PD_out2[N:0], and PD_out3[N:0] for driving the main driver 1110 such that an output resistance value corresponding to the emphasis code or pull down resistance calibration code ZQ_N is provided.

The pull up pre-driver 1120 and the pull down pre-driver 1130 provide the main driver 1110 with the first to third pull up driving signals PU_out1[N:0], PU_out2[N:0], and PU_out3[N:0] and the first to third pull down driving signals PD_out1[N:0], PD_out2[N:0], and PD_out3[N:0], respectively. The main driver 1110 generates the data signal DATA such that the data signal DATA for providing the pull up and pull down data Dout_pu and Dout_pd to the channel is driven by an output resistance value that is determined according to the pull up and pull down resistance calibration codes ZQ_P and ZQ_N or the emphasis code.

On the basis of a configuration of the main driver 1110, the first to third pull up driving signals PU_out1[N:0], PU_out2[N:0], and PU_out3[N:0] and the first to third pull down driving signals PD_out1[N:0], PD_out2[N:0], and PD_out3[N:0] may be configured with driving signals for providing the same data or opposite data. Below, it is assumed that the first to third pull up driving signals PU_out1[N:0], PU_out2[N:0], and PU_out3[N:0] and the first to third pull down driving signals PD_out1[N:0], PD_out2[N:0], and PD_out3[N:0] are configured with driving signals for providing the same data to the main driver 1110.

Figure 3:
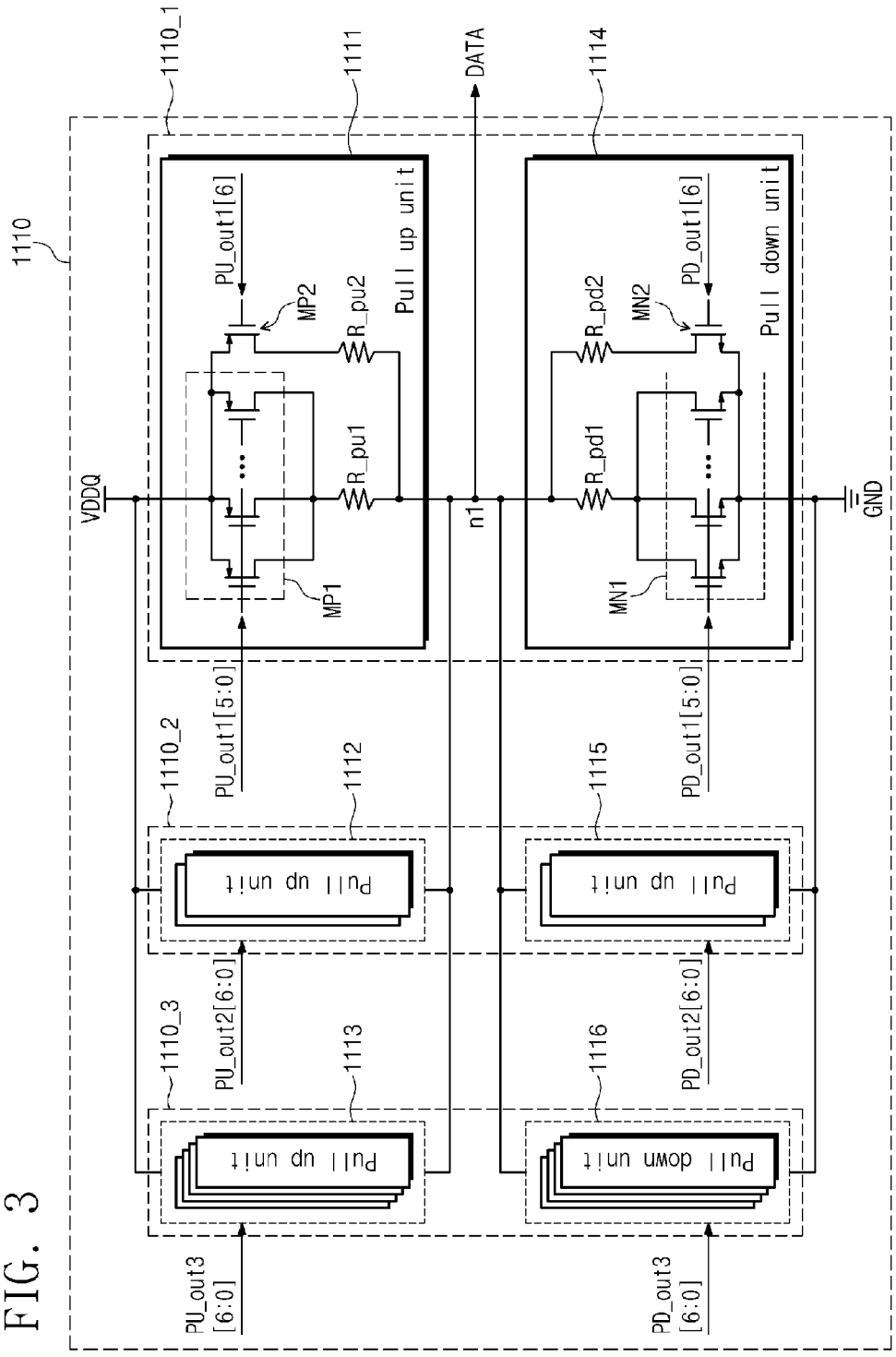
FIG. 3 is a circuit diagram illustrating a main driver illustrated in FIG. 2 according to example embodiments.

FIG. 3 is a circuit diagram illustrating a main driver illustrated in FIG. 2 according to example embodiments. FIG. 3 will be described with reference to FIG. 2. The main driver 1110 may include a first main driver 1110_1, a second main driver 1110_2, and a third main driver 1110_3. The first main driver 1110_1 may include a first pull up driver unit 1111 and a first pull down driver unit 1114. The second main driver 1110_2 may include a second pull up driver unit 1112 and a second pull down driver unit 1115. The third main driver 1110_3 may include a third pull up driver unit 1113 and a third pull down driver unit 1116.

The first to third pull up driver units 1111 to 1113 are connected in parallel between a driving voltage VDDQ and a node n1. The first pull up driver unit 1111 may include one pull up unit. The second pull up driver unit 1112 may include two pull up units that are connected in parallel, and the third pull up driver unit 1113 may include four pull up units that are connected in parallel. The pull up unit included in the first pull up driver unit 1111 is driven by the first pull up driving signals PU_out1[N:0]. The two pull up units included in the second pull up driver unit 1112 are driven by the second pull up driving signals PU_out2[N:0], respectively. The four pull up units included in the third pull up driver unit 1113 are driven by the third pull up driving signals PU_out3[N:0], respectively.

The pull up unit included in the first pull up driver unit 1111 may include a plurality of transistors MP1 and a main transistor MP2. Transistors included in the plurality of transistors MP1 and the main transistor MP2 may be turned on or turned off by the first pull up driving signals PU_out1[N:0], respectively. In detail, the transistors included in the plurality of transistors MP1 and the main transistor MP2 may be turned on or turned off by bit values of the first pull up driving signal PU_out1[N:0].

For example, in the case where the first pull up driving signal PU_out1[N:0] is a 7-bit signal, the plurality of transistors MP1 may include six transistors. The six transistors may be turned on or turned off by bit values of the first pull up driving signal PU_out1[5:0], respectively. However, if necessary, the number of bits constituting the first pull up driving signal PU_out1[5:0] and the number of transistors included in the plurality of transistors MP1 may be changed. Also, the plurality of transistors MP1 and the main transistor MP2 may be implemented with a plurality of NMOS transistors instead of the PMOS transistors, based on a termination or driving scheme.

A current may flow or may not flow to a first pull up resistor R_pu1, based on whether each transistor included in the plurality of transistors MP1 is turned on or turned off. Accordingly, an equivalent resistance value of a pull up unit may be changed. For example, an equivalent resistance value of a pull up unit may be changed by the first pull up driving signal PU_out1[5:0]. The main transistor MP2 is driven whenever the main driver 1110 drives the data signal DATA as "H". The main transistor MP2 and a second pull up resistor R_pu2 are connected in series between the driving voltage VDDQ and the node n1. The main transistor MP2 and the second pull up resistor R_pu2 determine the maximum resistance value of the equivalent resistance value of the main driver 1110. Below, it is assumed that the plurality of transistors MP1 include six transistors and the first pull up driving signal PU_out1[N:0] is a 7-bit signal.

The first to third pull down driver units 1114 to 1116 are connected in parallel between the node n1 and a ground voltage GND. The first pull down driver unit 1114 may include one pull down unit. The second pull down driver unit 1115 may include two pull down units that are connected in parallel, and the third pull down driver unit 1116 may include four pull down units that are connected in parallel. The pull down unit included in the first pull down driver unit 1114 is driven by the first pull down driving signals PD_out1[N:0]. The two pull down units included in the second pull down driver unit 1115 are driven by the second pull down driving signals PD_out2[N:0], respectively. The four pull down units included in the third pull down driver unit 1116 are driven by the third pull down driving signals PD_out3[N:0], respectively.

The pull down unit included in the first pull down driver unit 1114 may include a plurality of transistors MN1 and a main transistor MN2. Transistors included in the plurality of transistors MN1 and the main transistor MN2 may be turned on or turned off by the first pull down driving signal PD_out1[N:0]. In detail, the transistors included in the plurality of transistors MN1 and the main transistor MN2 may be turned on or turned off by bit values of the first pull down driving signal PD_out1[N:0].

For example, in the case where the first pull down driving signal PD_out1[N:0] is a 7-bit signal, the plurality of transistors MN1 may include six transistors. The six transistors may be turned on or turned off by bit values of the first pull down driving signal PD_out1[5:0], respectively. However, if necessary, the number of bits constituting the first pull down driving signal PD_out1[5:0] and the number of transistors included in the plurality of transistors MN1 may be changed. Also, the plurality of transistors MN1 and the main transistor MN2 may be implemented with a plurality of PMOS transistors instead of the NMOS transistors, based on a termination or driving scheme.

A current may flow or may not flow to a first pull down resistor R_pd1, based on whether each transistor included in the plurality of transistors MN1 is turned on or turned off. Accordingly, an equivalent resistance value of a pull down unit may be changed. For example, an equivalent resistance value of a pull down unit may be changed by the first pull down driving signal PD_out1[5:0]. The main transistor MN2 is driven whenever the main driver 1110 drives the data signal DATA as "L". The main transistor MN2 and a second pull down resistor R_pd2 are connected in series between the node n1 and the ground voltage GND. The main transistor MN2 and the second pull down resistor R_pd2 determine the maximum resistance value of the equivalent resistance value of the main driver 1110. Below, it is assumed that the plurality of transistors MN1 include six transistors and the first pull down driving signal PD_out1[N:0] is a 7-bit signal.

Figure 4:
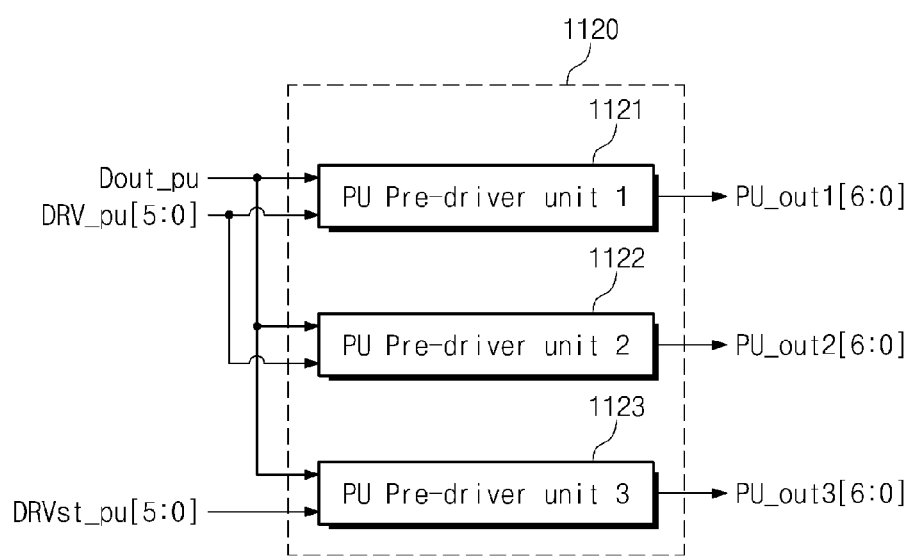
FIG. 4 is a block diagram illustrating a pull up pre-driver illustrated in FIG. 2 according to example embodiments.

FIG. 4 is a block diagram illustrating a pull up pre-driver illustrated in FIG. 2 according to example embodiments. Referring to FIG. 4, the pull up pre-driver 1120 may include first to third pull up pre-driver units 1121 to 1123. Each of the first to third pull up pre-driver units 1121 to 1123 may include the same configuration.

Each of the first and second pull up pre-driver units 1121 and 1122 is provided with the pull up data Dout_pu and the pull up pre-driving signal DRV_pu[5:0]. The first pull up pre-driver unit 1121 generates the first pull up driving signal PU_out1[6:0] based on the provided data and signal, and the second pull up pre-driver unit 1122 generates the second pull up driving signal PU_out2[6:0] based on the provided data and signal.

Also, the third pull up pre-driver unit 1123 is provided with the pull up data Dout_pu and the pull up auxiliary driving signal DRVst_pu[5:0]. The third pull up pre-driver unit 1123 generates the third pull up driving signal PU_out3 [6:0] based on the provided data and signal. A configuration of the first pull up pre-driver unit 1121 will be described with reference to FIG. 5.

Figure 5:
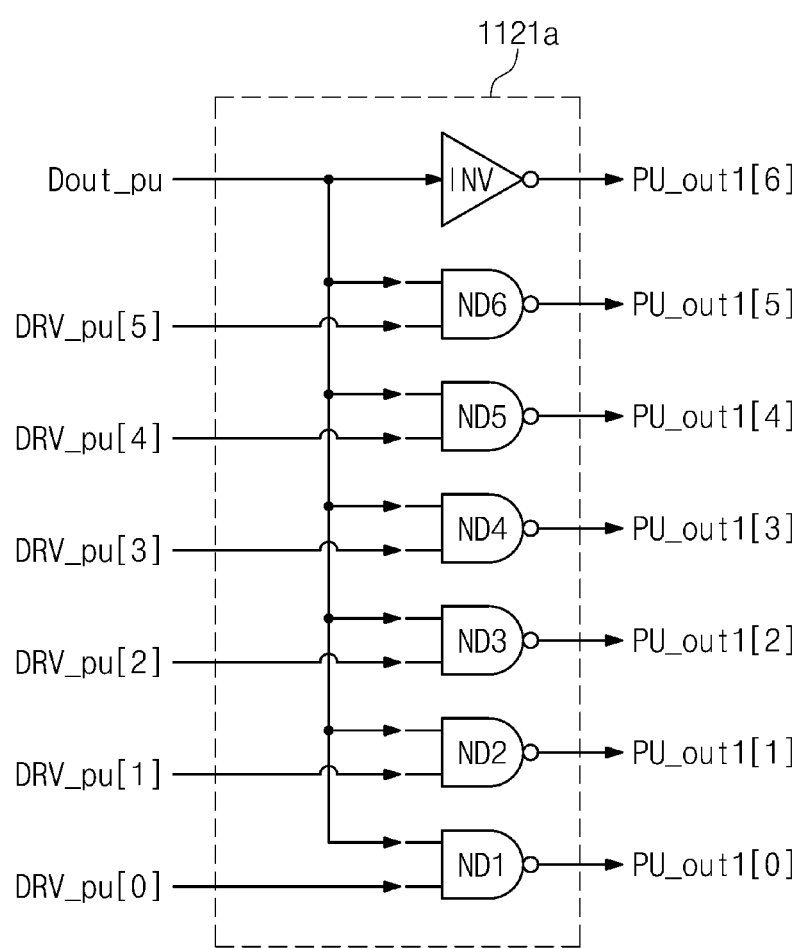
FIG. 5 is a circuit diagram illustrating a first pull up pre-driver unit illustrated in FIG. 4 according to example embodiments.

FIG. 5 is a circuit diagram illustrating a first pull up pre-driver unit illustrated in FIG. 4 according to example embodiments. The circuit diagram of FIG. 5 will be described with reference to FIGS. 3 and 4. Referring to FIG. 5, a first pull up pre-driver unit 1121a may include an inverter INV and first to sixth NAND gates ND1 to ND6. The first pull up pre-driver unit 1121a may generate the first pull up driving signal code PU_out1[6:0].

The inverter INV inverts the pull up data Dout_pu to output the first pull up driving signal PU_out1[6]. The first pull up driving signal PU_out1[6] is provided to the main transistor MP2 of the pull up driver unit 1111. As an example, the pull up data Dout_pu may be delayed by a plurality of inverters (not shown) and the delayed pull up data Dout_pu may be input to the inverter INV.

The first to sixth NAND gates ND1 to ND6 output the first pull up driving signals PU_out1[0] to PU_out1[5] based on the pull up pre-driving signals DRV_pu[0] to DRV_pu[5] and the pull up data Dout_Pu. The first pull up driving signals PU_out1[0] to PU_out1[5] are provided to the plurality of transistors MP1 of the first pull up driver unit 1111 in the main driver 1110.

As an example, in the case where the pull up pre-driver 1120 is provided with inverted pull up resistance calibration codes ZQ_P through the pull up pre-driving signal DRV_pu [5:0], each of the first pull up driving signals PU_out1[0] to PU_out1[5] has a logical level for providing an output resistance value corresponding to the pull up resistance calibration code ZQ_P. As another example, in the case where the pull up pre-driver 1120 is provided with an inverted code of emphasis code, each bit of which has logic "1", through the pull up pre-driving signal DRV_pu[5:0], each of the first pull up driving signals PU_out1[0] to PU_out1[5] has logic "0". In this case, the emphasis code may be "000000". When the first pull up driving signal PU_out1[5:0], each bit of which has logic "0", is provided to the first pull up driver unit 1111, the plurality of transistors MP1 included in the first pull up driver unit 1111 are all turned on, and thus, the first pull up driver unit 1111 may provide a minimum output resistance.

Figure 6:
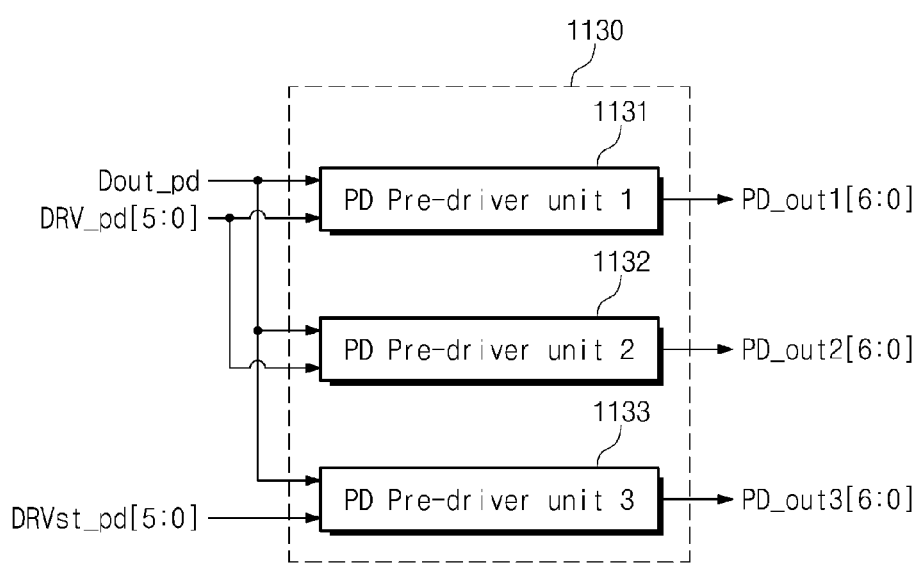
FIG. 6 is a block diagram illustrating a pull down pre-driver illustrated in FIG. 2 according to example embodiments.

FIG. 6 is a block diagram illustrating a pull down pre-driver illustrated in FIG. 2 according to example embodiments. Referring to FIG. 6, the pull down pre-driver 1130 may include first to third pull down pre-driver units 1131 to 1133. Each of the first to third pull down pre-driver units 1131 to 1133 may include the same configuration.

Each of the first and second pull down pre-driver units 1131 and 1132 is provided with the pull down data Dout_pd and the pull down pre-driving signal DRV_pd[5:0]. The first pull down pre-driver unit 1131 generates the first pull down driving signal PD_out1[6:0] based on the provided data and signal, and the second pull down pre-driver unit 1132 generates the second pull down driving signal PD_out2[6:0] based on the provided data and signal.

Also, the third pull down pre-driver unit 1133 is provided with the pull down data Dout_pd and the pull down auxiliary driving signal DRVst_pd[5:0]. The third pull down pre-driver unit 1133 generates the third pull down driving signal PD_out3[6:0] based on the provided data and signal. A configuration of the first pull down pre-driver unit 1131 will be described with reference to FIG. 7.

Figure 7:
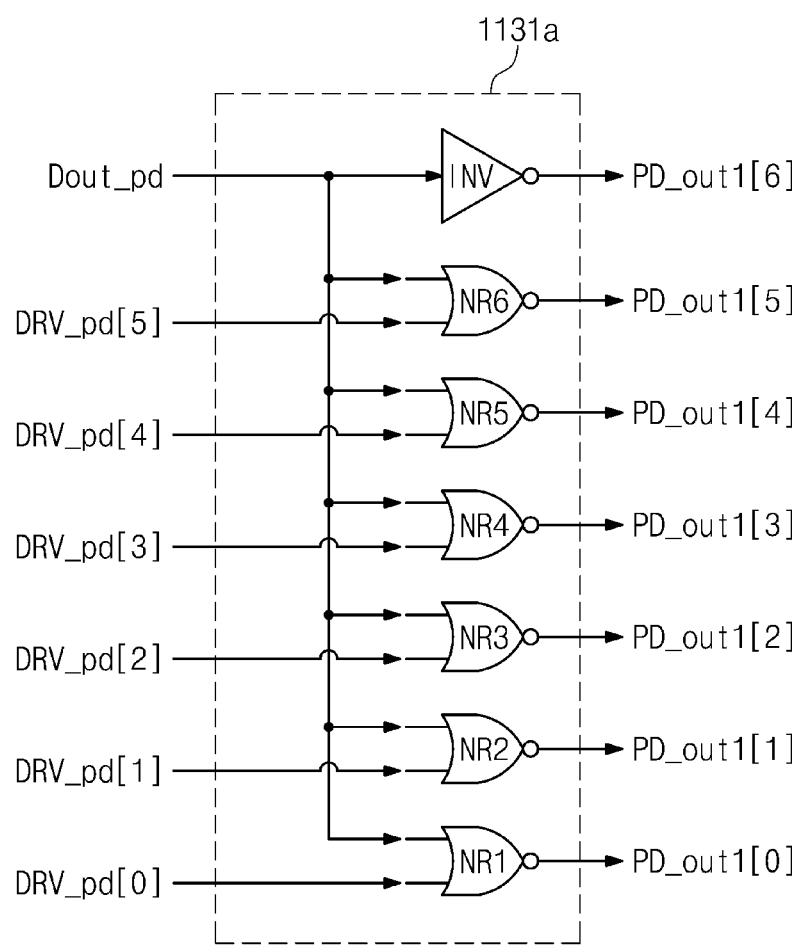
FIG. 7 is a circuit diagram illustrating a first pull down pre-driver unit illustrated in FIG. 6 according to example embodiments.

FIG. 7 is a circuit diagram illustrating a first pull down pre-driver unit illustrated in FIG. 6 according to example embodiments. FIG. 7 will be described with reference to FIGS. 3 and 6. Referring to FIG. 7, a first pull down pre-driver unit 1131a may include an inverter INV and first to sixth NOR gates NR1 to NR6.

The inverter INV inverts the pull down data Dout_pd to output the first pull down driving signal PD_out1[6]. The first pull down driving signal PD_out1[6] is provided to the transistor MN2 of the first pull down driver unit 1114.

The first to sixth NOR gates NR1 to NR6 output the first pull down driving signals PD_out1[0] to PD_out1[5] based on the pull down pre-driving signals DRV_pd[0] to DRV_pd [5] and the pull down data Dout_pd. The first pull down driving signal PD_out1[5:0] is provided to the plurality of transistors MN1 of the first pull down driver unit 1114 in the main driver 1110.

As an example, in the case where the pull down pre-driver 1130 is provided with inverted pull down resistance calibration codes ZQ_N through the pull down pre-driving signal DRV_pd[5:0], each of the first pull down driving signals PD_out1[0] to PU_out1[5] has a logical level for providing an output resistance value corresponding to the pull down resistance calibration code ZQ_N. As another example, in the case where the pull down pre-driver 1130 is provided with an inverted code of emphasis code, each bit of which has logic "0", through the pull down pre-driving signal DRV_pd[5:0], each of the first pull down driving signals PD_out1[0] to PD_out1[5] has logic "1". In this case, the emphasis code may be "111111". When the first pull down driving signal PD_out1[5:0], each bit of which has logic "1", is provided to the first pull down driver unit 1114, the plurality of transistors MN1 included in the first pull down driver unit 1114 are all turned on, and thus, the first pull down driver unit 1114 may provide a minimum output resistance value.

In example embodiments, the pre-driver 1140 may include first to third pre-drivers. The first pre-driver may include the first pull up pre-driver unit 1121 and the first pull down pre-driver unit 1131. The second pre-driver may include the second pull up pre-driver unit 1122 and the second pull down pre-driver unit 1132. The third pre-driver may include the third pull up pre-driver unit 1123 and the third pull down pre-driver unit 1133.

Figure 8A:
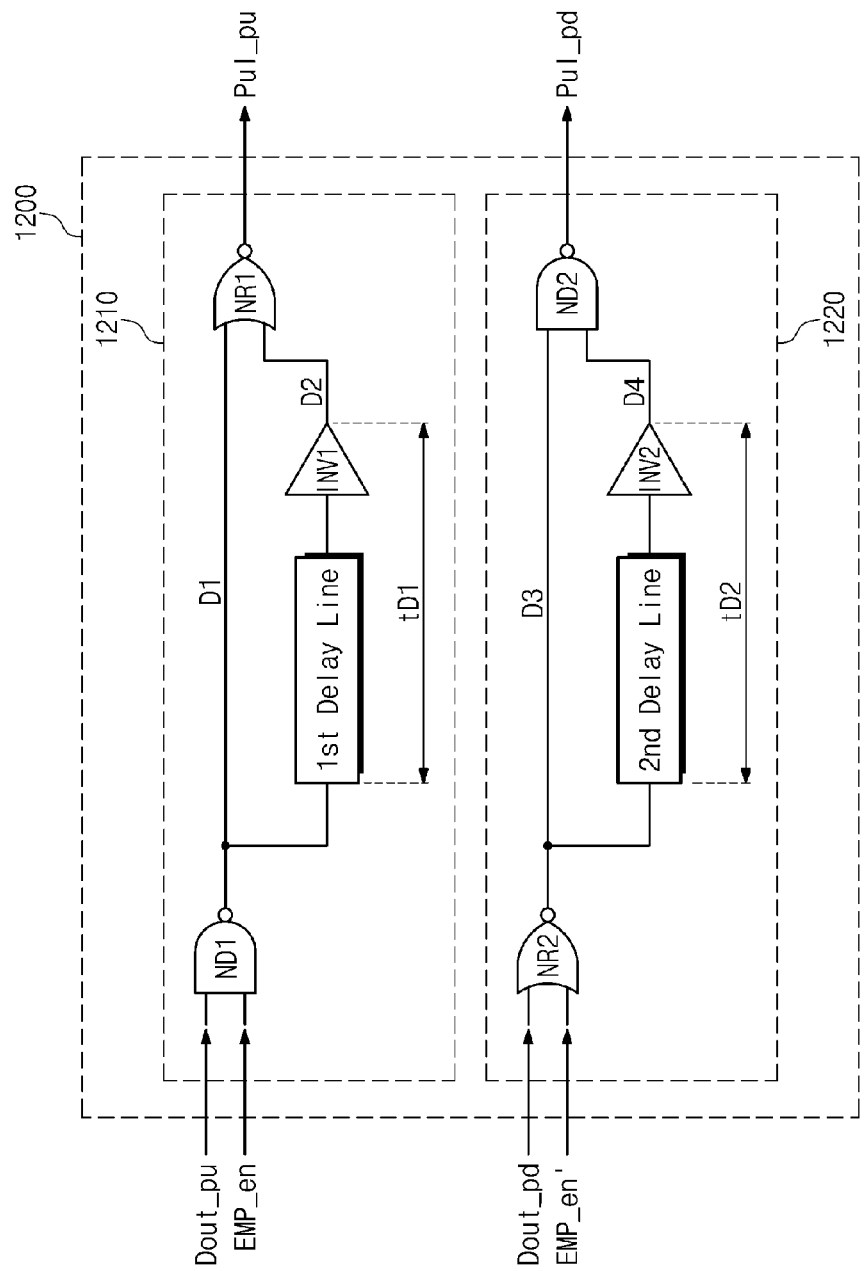
FIG. 8A is a circuit diagram illustrating a pulse generator illustrated in FIG. 1 according to example embodiments.
Figure 8B:
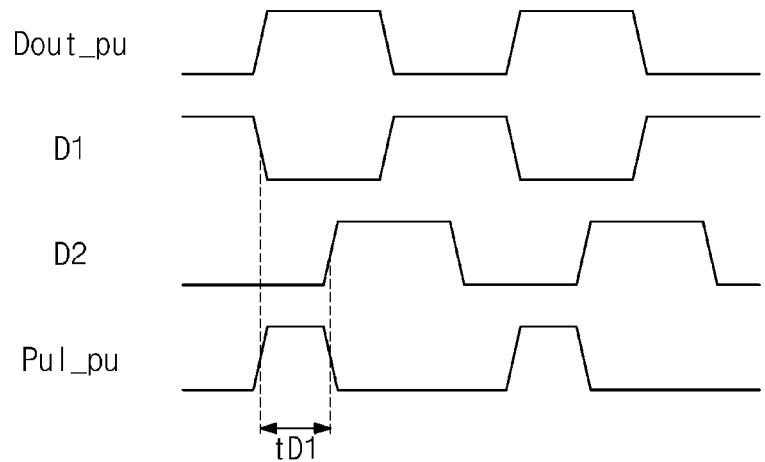
FIGS. 8B and 8C are drawings illustrating an output signal of the pulse generator of FIG. 8A.
Figure 8C:
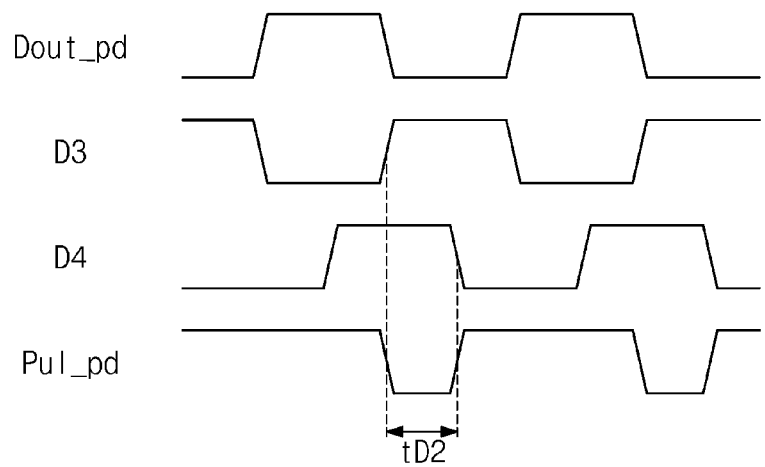

FIG. 8A is a circuit diagram illustrating a pulse generator illustrated in FIG. 1 according to example embodiments, and FIGS. 8B and 8C are drawings illustrating an output signal of the pulse generator of FIG. 8A. FIGS. 8A to 8C will be described with reference to FIGS. 1 and 2.

Referring to FIG. 8A, the pulse generator 1200 may include a pull up pulse generator 1210 and a pull down pulse generator 1220. The pull up pulse generator 1210 and the pull down pulse generator 1220 generate a pull up pulse Pul_pu and a pull down pulse Pul_pd, respectively.

The pull up pulse generator 1210 may include a first NAND gate ND1, a first NOR gate NR1, a first delay line (e.g., a plurality of even numbered inverters), and a first inverter INV1. The first NAND gate ND1 is provided with the pull up data Dout_pu and the emphasis control signal EMP_en.

As an example, in the case where the first NAND gate ND1 is provided with the emphasis control signal EMP_en of logic "1" (e.g., perform an emphasis operation), the first NAND gate ND1 inverts the pull up data Dout_pu to output a first data D1. The first data D1 is output as second data D2 after a first delay tD1 through the first delay line and the first inverter INV1. The first NOR gate NR1 is provided with the first and second data D1 and D2. Next, the first NOR gate NR1 generates the pull up pulse Pul_pu based on the first and second data D1 and D2. The pull up pulse Pul_pu includes a period corresponding to the first delay tD1 as a pulse period of logic "1".

As another example, in the case where the first NAND gate ND1 is provided with the emphasis control signal EMP_en of logic "0" (e.g., perform a normal operation), the first NAND gate ND1 outputs logic "1" as the first data D1 regardless of the pull up data Dout_pu. The first NOR gate NR1 that receives logic "1" outputs logic "0" as the pull up pulse Pul_pu regardless of the second data D2. For example, in the case where the pull up pulse generator 1210 is provided with the emphasis control signal EMP_en of logic "0", the pull up pulse generator 1210 does not generate the pulse signal. Accordingly, the pull up pulse generator 1210 does not provide to perform the emphasis operation.

The pull down pulse generator 1220 may include a second NOR gate NR2, a second NAND gate ND2, a second delay line (e.g., a plurality of even numbered inverters), and a second inverter INV2. The second NOR gate NR2 is provided with the pull down data Dout_pd and an emphasis control bar signal EMP_en'.

As an example, in the case where the second NOR gate NR2 is provided with the emphasis control bar signal EMP_en' of logic "0" (e.g., perform an emphasis operation), the second NOR gate NR2 inverts the pull down data Dout_pd to output a third data D3. The third data D3 is output as a fourth data D4 after a second delay tD2 through the second delay line and the second inverter INV2. The second NAND gate ND2 is provided with the third and fourth data D3 and D4. Next, the second NAND gate ND2 generates the pull down pulse Pul_pd based on the third and fourth data D3 and D4. The pull down pulse Pul_pd includes a period corresponding to the second delay tD2 as a pulse period of logic "0".

As another example, in the case where the second NOR gate NR2 is provided with the emphasis control bar signal EMP_en' of logic "1" (e.g., perform a normal operation), the second NOR gate NR2 outputs logic "0" as the third data D3 regardless of the pull down data Dout_pd. The second NAND gate ND2 that receives logic "0" outputs logic "1" as the pull down pulse Pul_pd regardless of the fourth data D4. For example, in the case where the pull down pulse generator 1220 is provided with the emphasis control bar signal EMP_en' of logic "1", the pull down pulse generator 1220 does not generate the pulse signal. Accordingly, the pull down pulse generator 1220 does not provide to perform the emphasis operation.

Referring to FIG. 8B, a waveform of the pull up pulse Pul_pu generated by the pull up pulse generator 1210 is illustrated. As described above, the pull up pulse Pul_pu includes a pulse of logic "1", which is generated in a period in which the first and second data D1 and D2 are all logic "0". The corresponding pulse is maintained during a period corresponding to the first delay tD1. The pull up pulse Pul_pu may include an enabled period of time tD1 of "H" and a disabled period of time of "L".

Referring to FIG. 8C, a waveform of the pull down pulse Pul_pd generated by the pull down pulse generator 1220 is illustrated. As described above, the pull down pulse Pul_pd includes a pulse of logic "0", which is generated in a period in which the third and fourth data D3 and D4 are all logic "1". The corresponding pulse is maintained during a period corresponding to the second delay tD2. The pull down pulse Pul_pd may include an enabled period of time tD2 of "L" and disabled period of time of "H".

Figure 9:
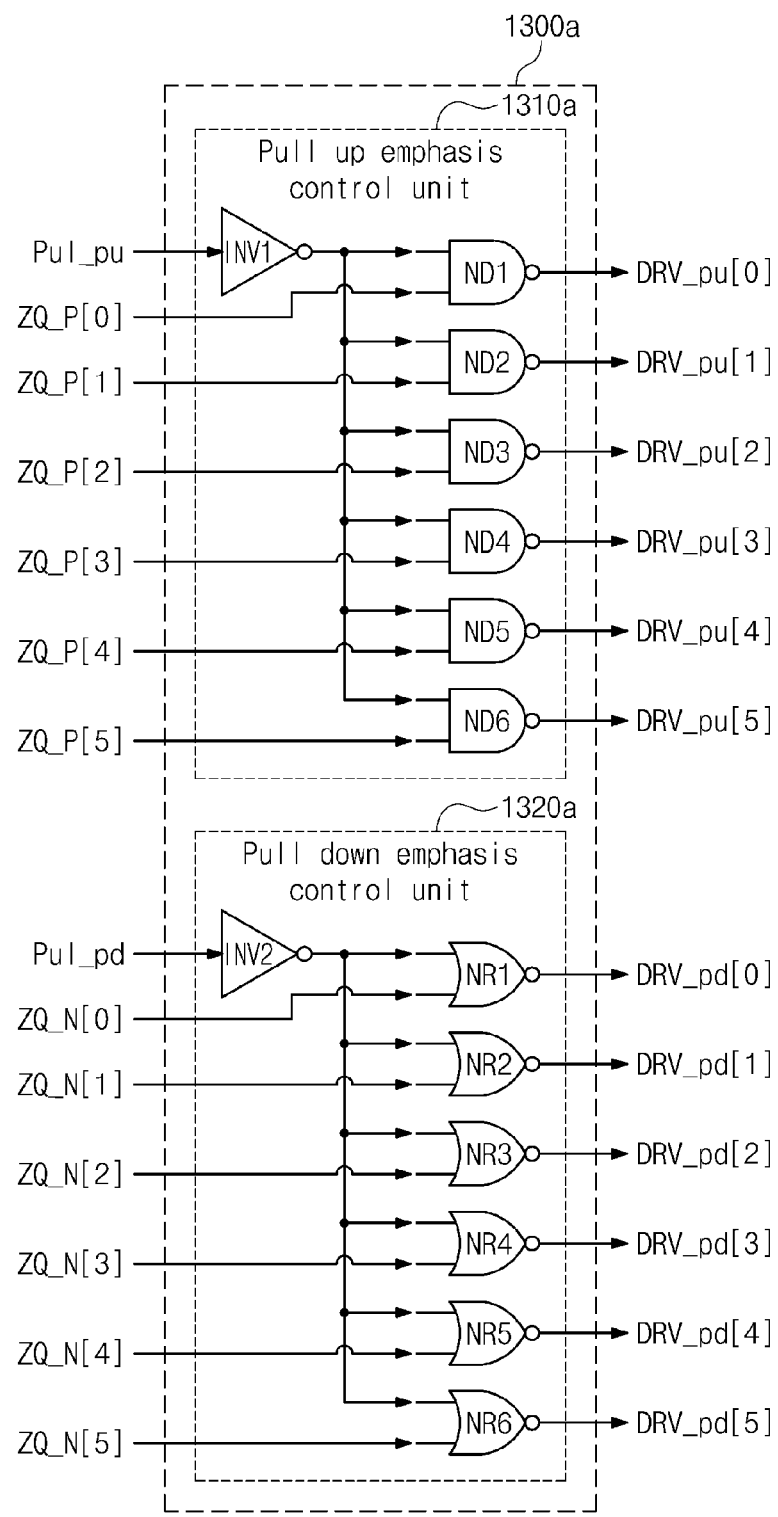
FIG. 9 is a circuit diagram illustrating an emphasis controller illustrated in FIG. 1 according to example embodiments.

FIG. 9 is a circuit diagram illustrating an emphasis controller illustrated in FIG. 1 according to example embodiments. The circuit diagram of FIG. 9 will be described with reference to FIGS. 1 and 2. Referring to FIG. 9, an emphasis controller 1300a may include pull up and pull down emphasis control units 1310a and 1320a.

The pull up emphasis control unit 1310a may include a first inverter INV1 and first to sixth NAND gates ND1 to ND6. The first inverter INV1 outputs an inverted signal of the pull up pulse Pul_pu provided from the pulse generator 1200.

The first to sixth NAND gates ND1 to ND6 are respectively provided with the pull up resistance calibration code values ZQ_P[0] to ZQ_P[5] and are provided in common with an output signal of the first inverter INV1. When the output signal of the first inverter INV1 is logic "1", for example, in a normal operation, the first to sixth NAND gates ND1 to ND6 invert the pull up resistance calibration code values ZQ_P[0] to ZQ_P[5] to output the pull up pre-driving signals DRV_pu[0] to DRV_pu[5]. When the output signal of the first inverter INV1 is logic "0", for example, in a pre-emphasis operation, the first to sixth NAND gates ND1 to ND6 output the pull up pre-driving signals DRV_pu[0] to DRV_pu[5] each having logic "1". Thus, the pull up emphasis control unit 1310a outputs all the pull up pre-driving signals DRV_pu[0] to DRV_pu[5] of logic "1" regardless of the pull up resistance calibration code values ZQ_P[0] to ZQ_P[5] in the pre-emphasis operation.

In other example embodiments, the pull up emphasis control unit 1310a may not use the pull up pulse Pul_pu. In this case, all the pull up pre-driving signals DRV_pu[0] to DRV_pu[5] may not need to be logic "1" in an emphasis operation. For example, when the pull up emphasis control unit 1310a outputs four of pull up pre-driving signals DRV_pu[0] to DRV_pu[5] having logic "1" in the normal operation (e.g., 110011), the number of pull up pre-driving signals DRV_pu[0] to DRV_pu[5] having logic "1" may be five in the pre-emphasis operation (e.g., 110111). In detail, the pull up emphasis control unit 1310a may respectively receive second pull up resistance calibration code values ZQ_P'[0] to ZQ_P'[5] through input terminals of the first to sixth NAND gates ND1 to ND6 instead of the inverted pull up pulse Pul_pu such that a number of "1" of the pull up pre-driving signals DRV_pu[0] to DRV_pu[5] may be added. In the pre-emphasis operation, the second pull up resistance calibration code values ZQ_P'[0] to ZQ_P'[5] may be generated by subtracting 1 from the pull up resistance calibration code values ZQ_P[0] to ZQ_P[5]. For example, when the pull up resistance calibration code values ZQ_P[0] to ZQ_P[5] are "001100," (i.e., pull up pre-driving signals DRV_pu[0] to DRV_pu[5], "110011") the second pull up resistance calibration code values ZQ_P'[0] to ZQ_P'[5] may be "001011" (i.e., pull up pre-driving signals DRV_pu[0] to DRV_pu[5], "110111") by subtracting 1. As an example, the second pull up resistance calibration code values ZQ_P'[0] to ZQ_P'[5] may be logic "1" in the normal operation.

The pull down emphasis control unit 1320a may include a second inverter INV2 and first to sixth NOR gates NR1 to NR6. The second inverter INV2 outputs an inverted signal of the pull down pulse Pul_pd provided from the pulse generator 1200.

The first to sixth NOR gates NR1 to NR6 are respectively provided with the pull down resistance calibration code values ZQ_N[0] to ZQ_N[5] and are provided in common with an output signal of the second inverter INV2. When the output signal of the second inverter INV2 is logic "0", for example, in a normal operation, the first to sixth NOR gates NR1 to NR6 invert the pull down resistance calibration code values ZQ_N[0] to ZQ_N[5] to output the pull down pre-driving signals DRV_pd[0] to DRV_pd[5]. When the output signal of the second inverter INV2 is logic "1", for example, in the pre-emphasis operation, the first to sixth NOR gates NR1 to NR6 output the pull down pre-driving signals DRV_pd[0] to DRV_pd[5] each having logic "0". Thus, the pull down emphasis control unit 1320a outputs all the pull down pre-driving signals DRV_pd[0] to DRV_pd[5] of logic "0" regardless of the pull down resistance calibration code values ZQ_N[0] to ZQ_N[5] in the pre-emphasis operation.

In other example embodiments, the pull down emphasis control unit 1320a may not use the pull down pulse Pul_pd. In this case, all the pull down pre-driving signals DRV_pd[0] to DRV_pd[5] may not need to be logic "0" in an emphasis operation. For example, when the pull down emphasis control unit 1320a outputs two of pull down pre-driving signals DRV_pd[0] to DRV_pd[5] having logic "0" in the normal operation (e.g., 110011), the number of pull down pre-driving signals DRV_pd[0] to DRV_pd[5] having logic "0" may be three in the pre-emphasis operation (e.g., 110010). In detail, the pull down emphasis control unit 1320a may respectively receive second pull down resistance calibration code values ZQ_N' [0] to ZQ_N'[5] through input terminals of the first to sixth NOR gates NR1 to NR6 instead of the inverted pull down pulse Pul_pd such that a number of "0" of the pull down pre-driving signals DRV_pd[0] to DRV_pd[5] may be added. In the pre-emphasis operation, the second pull down resistance calibration code values ZQ_N' [0] to ZQ_N'[5] may be generated by adding 1 from the pull down resistance calibration code values ZQ_N[0] to ZQ_N[5]. For example, when the pull down resistance calibration code values ZQ_N[0] to ZQ_N[5] are "001100," (i.e., pull down pre-driving signals DRV_pd[0] to DRV_pd[5], "110011") the second pull down resistance calibration code values ZQ_N'[0] to ZQ_N'[5] may be "001101" (i.e., pull down pre-driving signals DRV_pd[0] to DRV_pd[5], "110010") by adding 1 in the pre-emphasis operation. As an example, the second pull down resistance calibration code values ZQ_N' [0] to ZQ_N' [5] may be logic "0" in the normal operation.

As an example, the pull up pre-driving signal DRV_pu [5:0], each bit of which is logic "1", and the pull down pre-driving signal DRV_pd[5:0], each bit of which is logic "0" correspond to the emphasis code for the pre-emphasis operation.

As another example, a number of pull up pre-driving signal DRV_pu[5:0], each bit of which is logic "1" and a number of pull down pre-driving signal DRV_pd[5:0], each bit of which is logic "0," in the pre-emphasis operation may be respectively greater than a number of pull up pre-driving signal DRV_pu[5:0], each bit of which is logic "1" and a number of pull down pre-driving signal DRV_pd[5:0], each bit of which is logic "0," in the normal operation.

Figure 10:
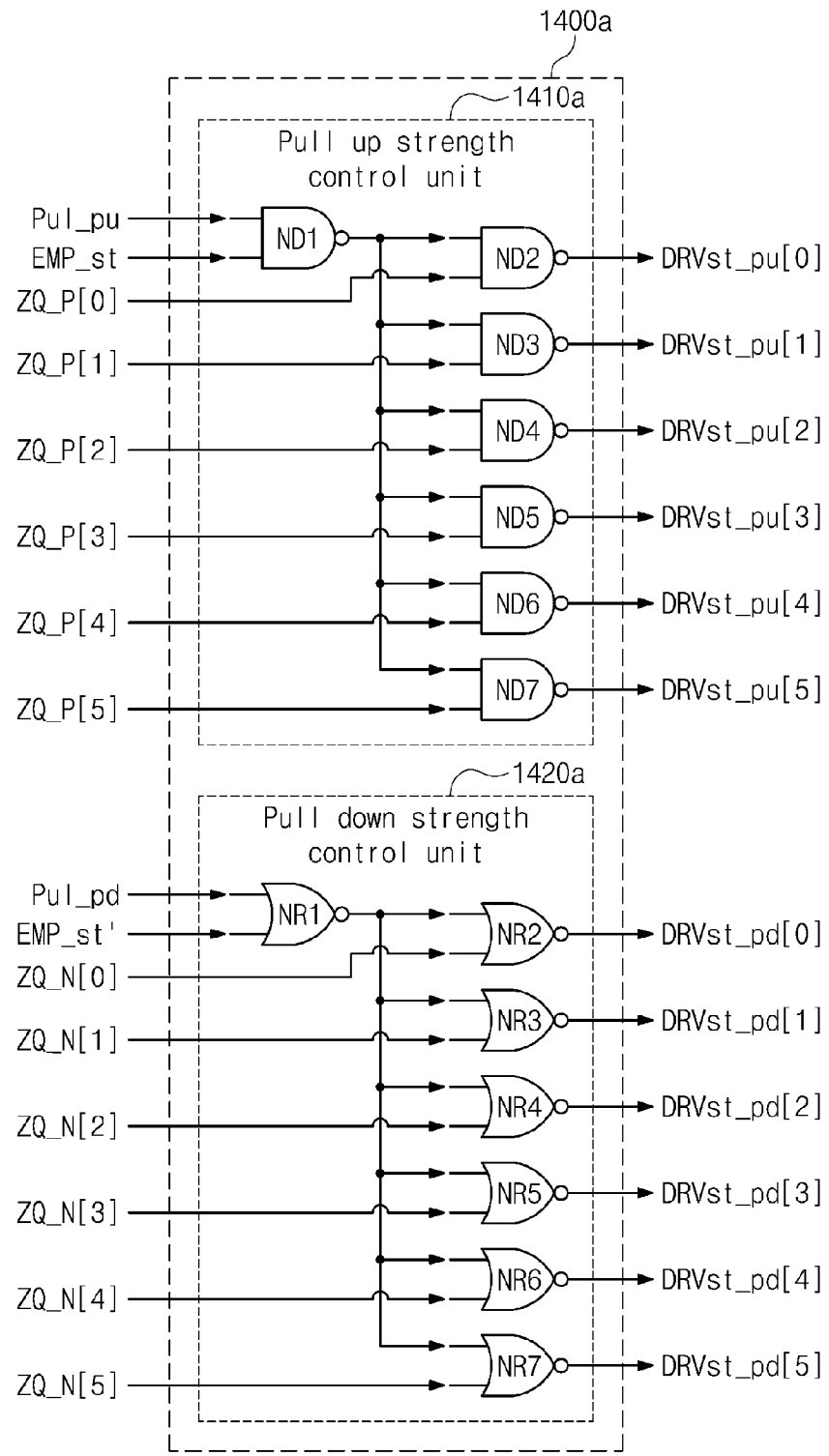
FIG. 10 is a circuit diagram illustrating an emphasis strength controller illustrated in FIG. 1 according to example embodiments.

FIG. 10 is a circuit diagram illustrating an emphasis strength controller illustrated in FIG. 1 according to example embodiments. The circuit diagram of FIG. 10 will be described with reference to FIGS. 1, 2, 3, and 9. Referring to FIG. 10, an emphasis strength controller 1400a may include pull up and pull down strength control units 1410a and 1420a. An operation and a configuration of the emphasis strength controller 1400a are similar to those of the emphasis controller 1300a except that the emphasis strength controller 1400a is further provided with the strength adjustment signal EMP_st.

The pull up strength control unit 1410a may include first to seventh NAND gates ND1 to ND7. The first NAND gate ND1 is provided with the pull up pulse Pul_pu and the strength adjustment signal EMP_st. As in the pull up emphasis controller 1310a, when the strength adjustment signal EMP_st is logic "1", the second to seventh NAND gates ND2 to ND7 of the pull up strength control unit 1410a output an inverted code of the pull up resistance calibration code values ZQ_P[0] to ZQ_P[5] or the inverted emphasis code values as the pull up auxiliary driving signals DRVst_pu[0] to DRVst_pu[5], based on the pull up pulse Pul_pu. For example, when the strength adjustment signal EMP_st is logic "1", the third pull up pre-driver unit 1123 that is provided with the pull up auxiliary driving signal DRVst_pu[5:0] may perform the pre-emphasis operation based on the pull up pulse Pul_pu.

When the strength adjustment signal EMP_st is logic "0" (e.g., a normal operation), the first NAND gate ND1 outputs logic "1" regardless of the pull up pulse Pul_pu. Accordingly, the second to seventh NAND gates ND2 to ND7 of the pull up strength control unit 1410a output inverted code values of the pull up resistance calibration code values ZQ_P[0] to ZQ_P[5] as the pull up auxiliary driving signals DRVst_pu[0] to DRVst_pu[N−1]. For example, when the strength adjustment signal EMP_st is logic "0", the third pull up pre-driver unit 1123 does not perform the pre-emphasis operation.

The pull down strength control unit 1420a may include first to seventh NOR gates NR1 to NR7. The first NOR gate NR1 is provided with the pull down pulse Pul_pd and a strength adjustment bar signal EMP_st'. When the strength adjustment bar signal EMP_st' is logic "0", as in the pull down emphasis control unit 1320a, the second to seventh NOR gates NR2 to NR7 of the pull down strength control unit 1420a output inverted code values of the pull down resistance calibration code values ZQ_N[0] to ZQ_N[5] or the inverted emphasis code values as the pull down auxiliary driving signals DRVst_pd[0] to DRVst_pd[5], based on the pull down pulse Pul_pd. For example, when the strength adjustment bar signal EMP_st' is logic "0", the third pull down pre-driver unit 1133 that is provided with the pull down auxiliary driving signal DRVst_pd[5:0] performs the pre-emphasis operation based on the pull down pulse Pul_pd.

When the strength adjustment bar signal EMP_st' is logic "1" (e.g., a normal operation), the first NOR logic NR1 outputs logic "0" regardless of the pull down pulse Pul_pd. Accordingly, the second to seventh NOR gates NR2 to NR7 of the pull down strength control unit 1420a output inverted code values of the pull down resistance calibration code values ZQ_N[0] to ZQ_N[5] as the pull down auxiliary driving signals DRVst_pd[0] to DRVst_pd[5] regardless of the pull down pulse Pul_pd. For example, when the strength adjustment bar signal EMP_st' is logic "1", the third pull down pre-driver unit 1133 does not perform the pre-emphasis operation.

Figure 12:
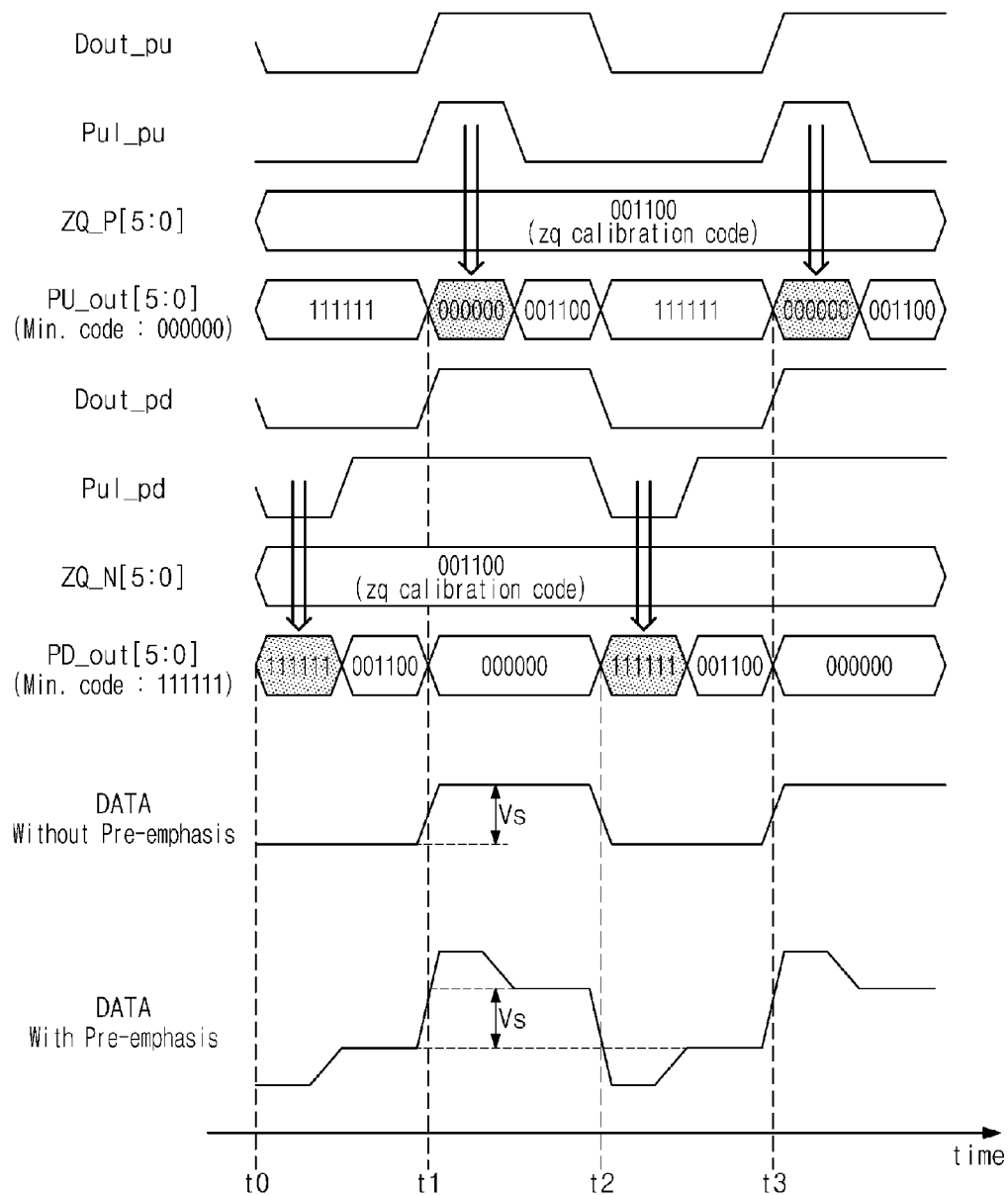

FIGS. 11 and 12 are a block diagram and a timing diagram for describing a pre-emphasis operation of an output buffer circuit of FIG. 1 according to example embodiments. FIGS. 11 and 12 will be described with reference to FIGS. 1, 2, and 3.

Referring to FIG. 11, the output buffer circuit 1000 is connected to an input buffer 4100 of an external device 4000 through an output pad 2000, a channel, and an input pad 3000. The input buffer 4100 is connected with a pull up resistor Ru and a pull down resistor Rd through a node n1. The pull up resistor Ru is connected between the driving voltage VDDQ and the node n1. The pull down resistor Rd is connected between the node n1 and the ground voltage GND. The pull up and pull down resistors Ru and Rd function as an on-die termination circuit of the external device 4000. The on-die termination circuit is a circuit that allows the external device 4000 to make impedance matching with the channel to improve the quality of data transmission. The on-die termination circuit of the external device 4000, which is composed of the pull up and pull down resistors Ru and Rd illustrated in FIG. 11, may be implemented in the form of center tap termination (CTT). However, this is only one example, and the on-die termination circuit of the external device 4000 may include all types of on-die termination.

In the case where the on-die termination circuit of the external device 4000 is implemented with a circuit of the CTT form, in general, the pull up and pull down resistors Ru and Rd have the same resistance value. Accordingly, a level of a data signal transitions with respect to an intermediate level of the driving voltage VDDQ. For example, a voltage level of a data signal that is sent from the output buffer circuit 1000 to the external device 4000 is determined by resistance division of an output resistance value of the output buffer circuit 1000 and the pull up and pull down resistors Ru and Rd. Accordingly, as the output resistance value of the output buffer circuit 1000 becomes smaller by the pre-emphasis operation, a voltage level of a data signal that is sent from the output buffer circuit 1000 to the external device 4000 becomes higher than a voltage level in the normal operation.

Referring to FIG. 12, internal signals for the pre-emphasis operation of the output buffer circuit 1000 and the data signal DATA output from the output buffer circuit 1000 are illustrated. As described above, the pull up and pull down data Dout_pu and Dout_pd may include the same data. Here, it is assumed that the pull up resistance calibration code ZQ_P is "001100" and the pull down resistance calibration code ZQ_N is "001100". In the case where the output buffer circuit 1000 does not perform the pre-emphasis operation, the data signal DATA transitions with amplitude of "Vs" at each of time points t1, t2, and t3.

In the case where the output buffer circuit 1000 performs the pre-emphasis operation, the output buffer circuit 1000 changes an output resistance value by the pre-emphasis operation at each of the time points t1, t2, and t3 at which the data signal DATA transitions. For example, at each of the time points t1 and t3 at which the data signal DATA transitions from logic "0" to logic "1", and the pull up pulse Pul_pu of logic "1" is output. During a pulse period of the pull up pulse Pul_pu, the output buffer circuit 1000 provides the emphasis code of "000000" to the first to third pull up driver units 1111 to 1113 of the main driver 1110. After the pulse period of the pull up pulse Pul_pu between the time points t1 and t2, the output buffer circuit 1000 provides the pull up resistance calibration code values, for example, "001100" to the first to third pull up driver units 1111 to 1113 of the main driver 1110 until the time point t2.

As described above, the emphasis code of "000000" is a resistance calibration code for minimizing an output resistance value of the first to third pull up driver units 1111 to 1113. Since the emphasis code is provided, an output resistance value of the first to third pull up driver units 1111 to 1113 is minimized. Accordingly, since the output resistance value of the output buffer circuit 1000 is minimized, a voltage level of the data signal DATA that is output by voltage division of the pull up and pull down resistors Ru and Rd of the external device 4000 illustrated in FIG. 11 may be increased.

Also, at each of the time points t0 and t2 at which the data signal DATA transitions from logic "1" to logic "0", and the pull down pulse Pul_pd of logic "0" is output. During a pulse period of the pull down pulse Pul_pd, the output buffer circuit 1000 provides the emphasis code of "111111" to the first to third pull down driver units 1114 to 1116 of the main driver 1110. After the pulse period of the pull down pulse Pul_pd between the time points t2 and t3, the output buffer circuit 1000 provides the pull down resistance calibration code values, for example, "001100" to the first to third pull down driver units 1114 to 1116 of the main driver 1110 until the time point t3. As described above, the emphasis code of "111111" is a resistance calibration code for minimizing an output resistance value of the first to third pull down driver units 1114 to 1116. Since the emphasis code is provided, an output resistance value of the first to third pull down driver units 1114 to 1116 is minimized. Accordingly, since the output resistance value of the output buffer circuit 1000 is minimized, a voltage level of the data signal DATA that is output by voltage division of the pull up and pull down resistors Ru and Rd of the external device 4000 illustrated in FIG. 11 may be decreased.

With the above description, the output buffer circuit 1000 outputs the data signal DATA that has amplitude larger than "Vs" in a pre-emphasis period. For example, the output buffer circuit 1000 provides an emphasis waveform that is obtained through the above-described pre-emphasis operation in FIG. 1.

The configuration and the operation of the output buffer circuit 1000 that performs the pre-emphasis operation are described above. A configuration of the output buffer circuit 1000 that performs the de-emphasis operation will be described below.

Figure 13:
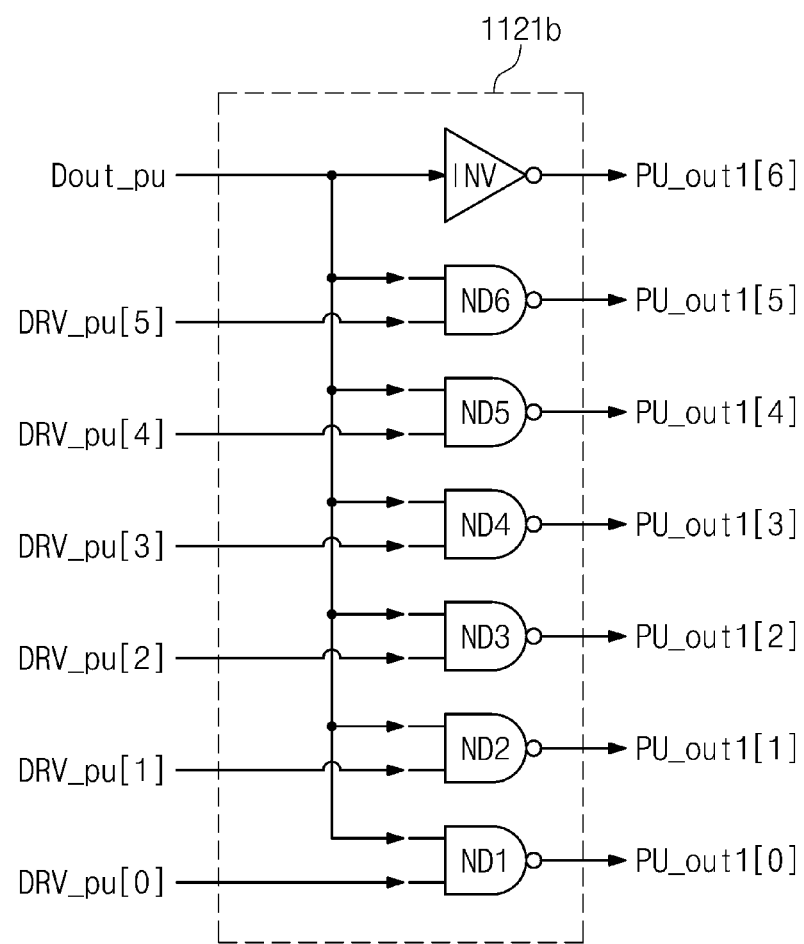
FIGS. 13 and 14 are circuit diagrams illustrating a first pull up pre-driver unit of FIG. 4 and a first pull down pre-driver unit of FIG. 6, which perform the de-emphasis operation, according to other example embodiments.
Figure 14:
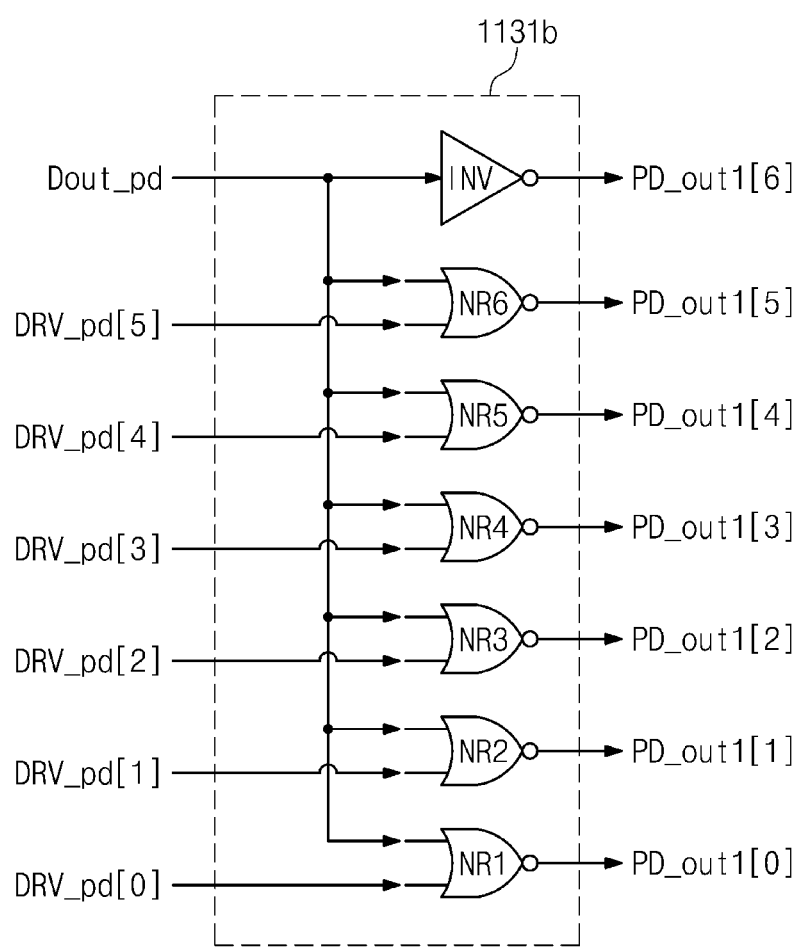

FIGS. 13 and 14 are circuit diagrams illustrating a first pull up pre-driver unit of FIG. 4 and a first pull down pre-driver unit of FIG. 6, which perform the de-emphasis operation, according to other example embodiments. FIGS. 13 and 14 will be described with reference to FIGS. 3 to 7.

Referring to FIG. 13, a first pull up pre-driver unit 1121*b* may include an inverter INV and first to sixth NAND gates ND1 to ND6. The first pull up pre-driver unit 1121*b* may generate the first pull up driving signal code PU_out1[6:0]. The inverter INV inverts the pull up data Dout_pu to output the first pull up driving signal PU_out1[6]. The first pull up driving signal PU_out1[6] is provided to the main transistor MP2 of the first pull up driver unit 1111.

The first to sixth NAND gates ND1 to ND6 output the first pull up driving signals PU_out1[0] to PU_out1[5] based on the pull up driving signals DRV_pu[0] to DRV_pu[5] and pull up data Dout_pu. The first pull up driving signals PU_out1[0] to PU_out1[5] are provided to the plurality of transistors MP1 of the first pull up driver unit 1111.

As an example, in the case where the pull up pre-driver 1120 is provided with the pull up resistance calibration codes ZQ_P through the pull up pre-driving signal DRV_pu [5:0], each of the first pull up driving signals PU_out1[0] to PU_out1[5] has a logical level for providing an output resistance value corresponding to the pull up resistance calibration code ZQ_P. As another example, in the case where the pull up pre-driver 1120 is provided with an inverted emphasis code for de-emphasis, each bit of which has logic "0", through the pull up pre-driving signal DRV_pu[5:0], each of the first pull up driving signals PU_out1[0] to PU_out1[5] has logic "1". In this case, the emphasis code may be "111111". When the first pull up driving signal PU_out1[5:0], each bit of which has logic "1", is provided to the first pull up driver unit 1111, the plurality of transistors MP1 included in the first pull up driver unit 1111 are all turned off, and thus, the first pull up driver unit 1111 may provide a maximum output resistance value.

Referring to FIG. 14, a first pull down pre-driver unit 1131b may include an inverter INV and first to sixth NOR gates NR1 to NR6. The inverter INV inverts the pull down data Dout_pd to output the first pull down driving signal PD_out1[6]. The first pull down driving signal PD_out1[6] is provided to the transistor MN2 of the first pull down driver unit 1114.

The first to sixth NOR logics NR1 to NR6 output the first pull down driving signals PD_out1[0] to PD_out1[5] based on pull down pre-driving signals DRV_pd[0] to DRV_pd[5] and pull down data Dout_pd. The first pull down driving signal PD_out1[5:0] is provided to the plurality of transistors MN1 of the first pull down driver unit 1114.

As an example, in the case where the pull down pre-driver 1130 is provided with the pull down resistance calibration codes ZQ_N through the pull down pre-driving signal DRV_pd[5:0], each of the first pull down driving signals PD_out1[0] to PU_out1[5] has a logical level for providing an output resistance value corresponding to the pull down resistance calibration code ZQ_N. As another example, in the case where the pull down pre-driver 1130 is provided with an inverted emphasis code for de-emphasis, each bit of which has logic "1", through the pull down pre-driving signal DRV_pd[5:0], each of the first pull down driving signals PD_out1[0] to PD_out1[5] has logic "0". In this case, the emphasis code may be "000000". When the first pull down driving signal PD_out1[5:0], each bit of which has logic "0", is provided to the first pull down driver unit 1114, the plurality of transistors MN1 included in the first pull down driver unit 1114 are all turned off, and thus, the first pull down driver unit 1114 provides a maximum output resistance value.

Figure 15:
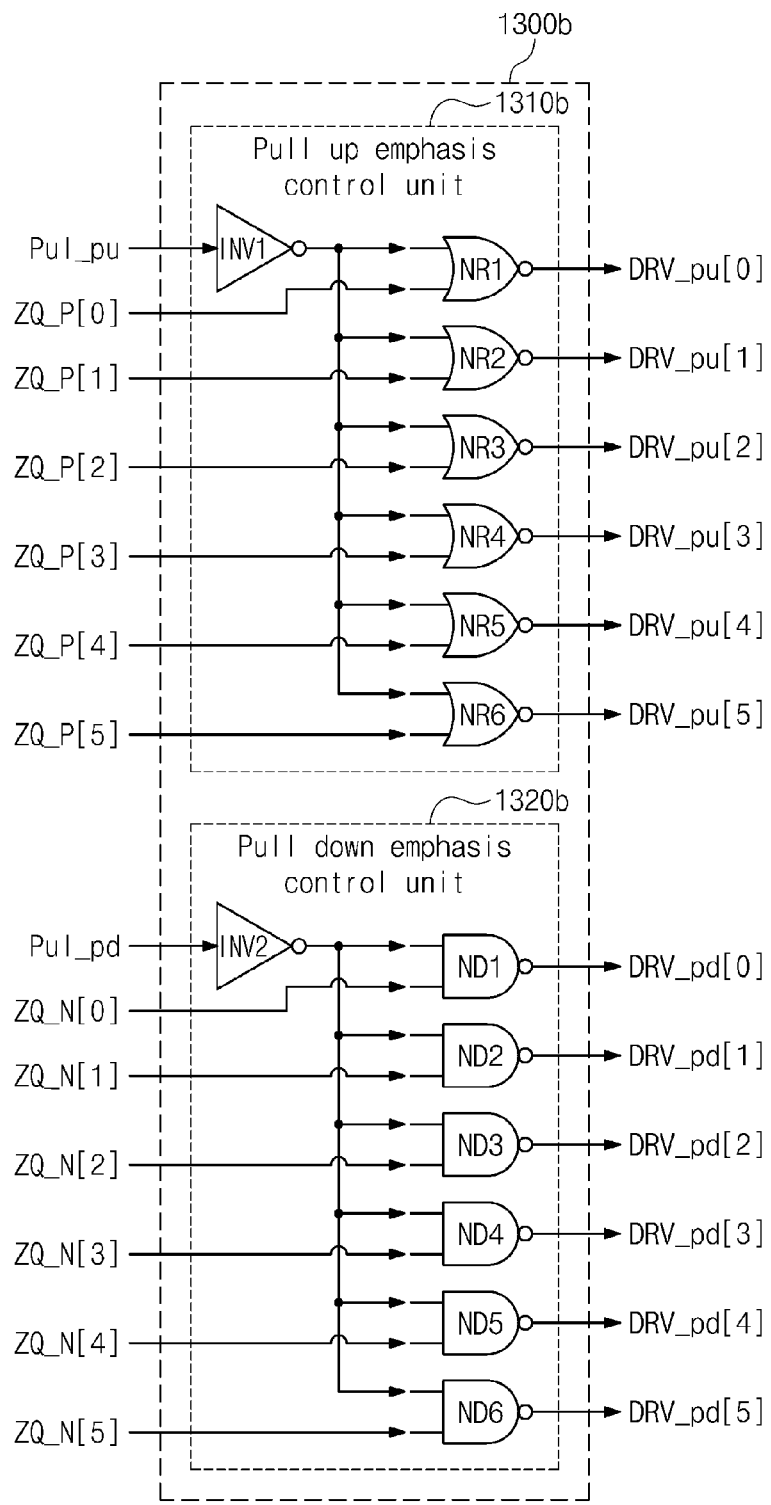
FIGS. 15 and 16 are circuit diagrams illustrating an emphasis controller and an emphasis strength controller of FIG. 1 that perform a de-emphasis operation, according to other example embodiments.
Figure 16:
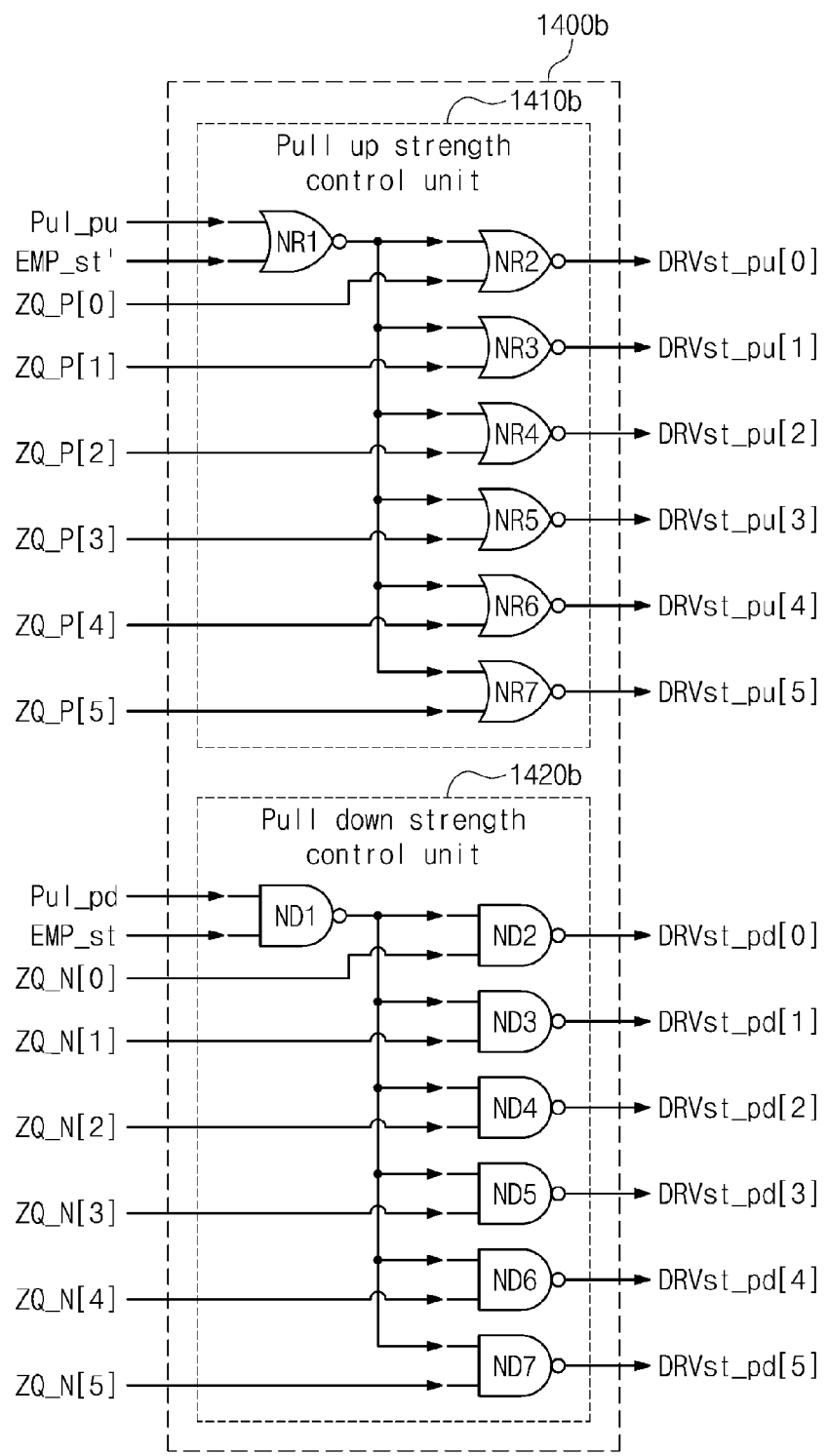

FIGS. 15 and 16 are circuit diagrams illustrating an emphasis controller and an emphasis strength controller of FIG. 1 that perform a de-emphasis operation, according to other example embodiments. FIGS. 15 and 16 will be described with reference to FIGS. 1, 2, 9, and 10.

Referring to FIG. 15, an emphasis controller 1300b may include pull up and pull down emphasis control units 1310b and 1320b.

The pull up emphasis control unit 1310b may include a first inverter INV1 and first to sixth NOR gates NR1 to NR6. The first inverter INV1 outputs an inverted signal of the pull up pulse Pul_pu provided from the pulse generator 1200.

The first to sixth NOR gates NR1 to NR6 are respectively provided with the pull up resistance calibration code values ZQ_P[0] to ZQ_P[5] and are provided in common with an output signal of the first inverter INV1. When the output signal of the first inverter INV1 is logic "0", for example, in the normal operation, the first to sixth NOR gates NR1 to NR6 invert the pull up resistance calibration code values ZQ_P[0] to ZQ_P[5] to output the pull up pre-driving signals DRV_pu[0] to DRV_pu[5]. When the output signal of the first inverter INV1 is logic "1", for example, in the de-emphasis operation, the first to sixth NOR gates NR1 to NR6 output the pull up pre-driving signals DRV_pu[0] to DRV_pu[5] each having logic "0". Thus, the pull up emphasis control unit 1310b outputs all the pull up pre-driving signals DRV_pu[0] to DRV_pu[5] of logic "0" regardless of the pull up resistance calibration code values ZQ_P[0] to ZQ_P[5] in the de-emphasis operation.

The pull down emphasis control unit 1320b may include a second inverter INV2 and first to sixth NAND gates ND1 to ND6. The second inverter INV2 outputs an inverted signal of the pull down pulse Pul_pd provided from the pulse generator 1200.

The first to sixth NAND gates ND1 to ND6 are respectively provided with the pull down resistance calibration code values ZQ_N[0] to ZQ_N[5] and are provided in common with an output signal of the second inverter INV2. When the output signal of the second inverter INV2 is logic "1", for example, in the normal operation, the first to sixth NAND gates ND1 to ND6 invert the pull down resistance calibration code values ZQ_N[0] to ZQ_N[5] to output the pull down pre-driving signals DRV_pd[0] to DRV_pd[5]. When the output signal of the first inverter INV2 is logic "0", for example, in the de-emphasis operation, the first to sixth NAND gates ND1 to ND6 output the pull down pre-driving signals DRV_pd[0] to DRV_pd[5] each having logic "1".

As an example, the pull up pre-driving signal DRV_pu[5:0], each bit of which is logic "0", and the pull down pre-driving signal DRV_pd[5:0], each bit of which is logic "1" correspond the emphasis code for the de-emphasis operation.

Referring to FIG. 16, an emphasis strength controller 1400b may include pull up and pull down strength control units 1410b and 1420b. An operation and a configuration of the emphasis strength controller 1400b are similar to those of the emphasis controller 1300b except that the emphasis strength controller 1400b is further provided with the strength adjustment signal EMP_st. Also, an operation and a configuration of the emphasis strength controller 1400b are similar to an operation and a configuration of the emphasis strength controller 1400a of FIG. 10.

The pull up strength control unit 1410b may include first to seventh NOR gates NR1 to NR7. The first NOR logic NR1 is provided with the pull up pulse Pul_pu and the strength adjustment bar signal EMP_st'. When the strength adjustment bar signal EMP_st' is logic "0", the second to seventh NOR logics NR2 to NR7 of the pull up strength control unit 1410b output inverted code values of the pull up resistance calibration code values ZQ_P[0] to ZQ_P[5] or the inverted emphasis code values for the de-emphasis operation as the pull up auxiliary driving signals DRVst_pu[0] to DRVst_pu[5], based on the pull up pulse Pul_pu, and thus, the de-emphasis operation is performed.

When the strength adjustment bar signal EMP_st' is logic "1", for example, in the normal operation, the first NOR logic NR1 outputs logic "0" regardless of the pull up pulse Pul_pu. Accordingly, the second to seventh NOR logics NR2 to NR7 of the pull up strength control unit 1410b output inverted code values of the pull up resistance calibration code values ZQ_P[0] to ZQ_P[5] as the pull up auxiliary driving signals DRVst_pu[0] to DRVst_pu[N−1], and thus, the pull up strength control unit 1410b does not perform the de-emphasis operation.

The pull down strength control unit 1420b may include first to seventh NAND gates ND1 to ND7. The first NAND gate ND1 is provided with the pull down pulse Pul_pd and the strength adjustment signal EMP_st. When the strength adjustment signal EMP_st is logic "1", the second to seventh NOR logics ND2 to ND7 of the pull down strength control unit 1420b output inverted code values of the pull down resistance calibration code values ZQ_N[0] to ZQ_N[5] or the inverted emphasis code values for the de-emphasis operation as the pull down auxiliary driving signals DRVst_pd[0] to DRVst_pd[5], based on the pull down pulse Pul_pd, and thus, the de-emphasis operation is performed.

When the strength adjustment signal EMP_st is logic "0", for example, in the normal operation, the first NAND gate ND1 outputs logic "1" regardless of the pull down pulse Pul_pd. Accordingly, the second to seventh NAND gates ND2 to ND7 of the pull down strength control unit 1420b output inverted code values of the pull down resistance calibration code values ZQ_N[0] to ZQ_N[5] as the pull down auxiliary driving signals DRVst_pd[0] to DRVst_pd [N−1] regardless of the pull down pulse Pul_pd, and thus, the pull down strength control unit 1420b does not perform the de-emphasis operation.

Figure 17:
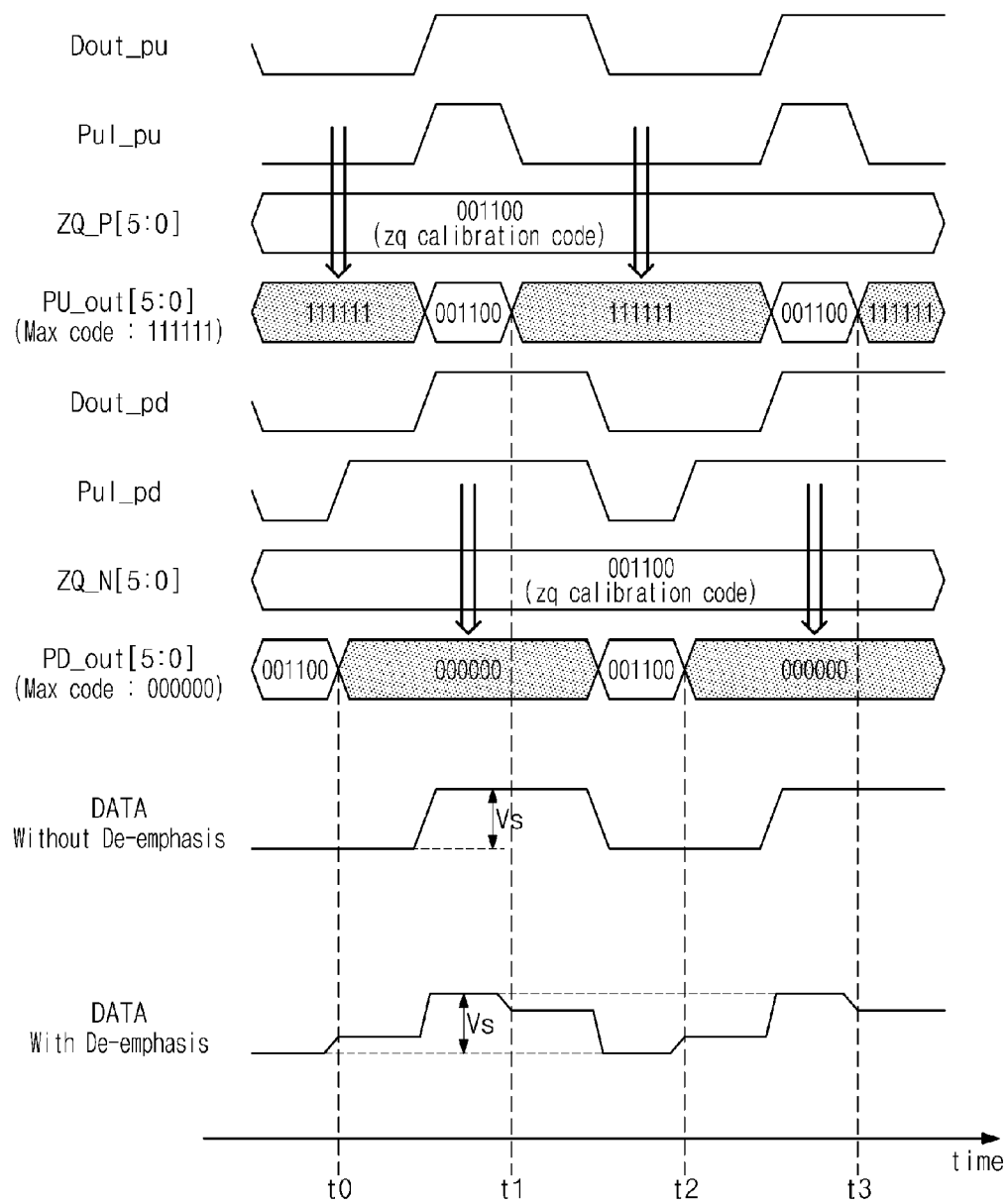
FIG. 17 is a timing diagram for describing a de-emphasis operation of an output buffer circuit of FIG. 1 that performs a de-emphasis operation, according to example embodiments.

FIG. 17 is a timing diagram for describing a de-emphasis operation of an output buffer circuit of FIG. 1 that performs a de-emphasis operation, according to example embodiments. Here, it is assumed that the pull up resistance calibration code ZQ_P is "001100" and the pull down resistance calibration code ZQ_N is "001100".

In the case where the output buffer circuit 1000 does not perform the de-emphasis operation, the data signal DATA transitions with amplitude of "Vs".

Each of time points t1, t2, and t3 corresponds to a start time point during a period in which the data signal DATA from the output buffer circuit 1000, which does not perform the de-emphasis operation, maintains a voltage level.

In the case where the output buffer circuit 1000 performs the de-emphasis operation, the output buffer circuit 1000 may change an output resistance value by the de-emphasis operation at each of the time points t1, t2, and t3 at which a voltage level of the data signal DATA is maintained at a predetermined voltage level. At each of the time points t0 and t2, the pull down pulse Pul_pd of logic "1" is output. During a disabled pulse period of the pull down pulse Pul_pd, the output buffer circuit 1000 provides the emphasis code of "000000" to the first to third pull down driver units 1114 to 1116 of the main driver 1110.

As described above, the emphasis code of "000000" is a resistance calibration code for maximizing an output resistance value of the first to third pull down driver units 1114 to 1116. Since the emphasis code is provided, an output resistance value of the first to third pull down driver units 1114 to 1116 is maximized. Accordingly, since the output resistance value of the output buffer circuit 1000 is maximized, a voltage level of the data signal DATA that is output by voltage division of the pull up and pull down resistors Ru and Rd of the external device 4000 illustrated in FIG. 11 may be increased.

Also, at each of the time points t1 and t3, the pull up pulse Pul_pu of logic "0" is output. During a disabled pulse period of the pull up pulse Pul_pu, the output buffer circuit 1000 provides the emphasis code of "111111" to the first to third pull up driver units 1111 to 1113 of the main driver 1110. As described above, the emphasis code of "111111" is a resistance calibration code for maximizing an output resistance value of the first to third pull up driver units 1111 to 1113. Since the emphasis code is provided, an output resistance value of the first to third pull up driver units 1111 to 1113 is maximized. Accordingly, since the output resistance value of the output buffer circuit 1000 is maximized, a voltage level of the data signal DATA that is output by voltage division of the pull up and pull down resistors Ru and Rd of the external device 4000 illustrated in FIG. 11 may be decreased.

With the above description, the output buffer circuit 1000 outputs the data signal DATA that has amplitude smaller than "Vs" in a de-emphasis period. For example, the output buffer circuit 1000 provides an emphasis waveform that is obtained through the above-described de-emphasis in FIG. 1.

Figure 18:
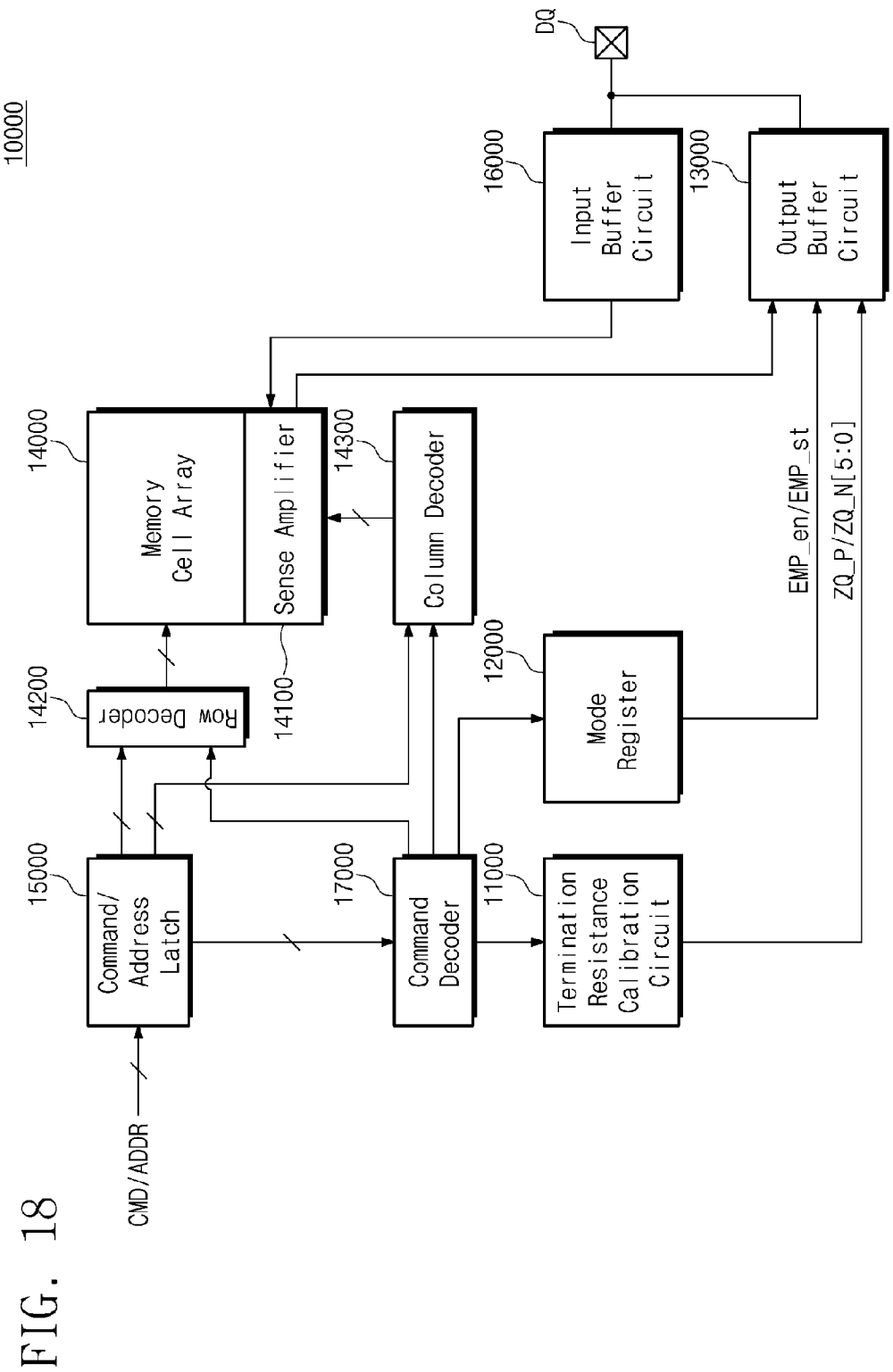
FIG. 18 is a block diagram illustrating a memory device including an output buffer circuit of FIG. 1 according to example embodiments.

FIG. 18 is a block diagram illustrating a memory device including an output buffer circuit of FIG. 1 according to example embodiments. A memory device 10000 may be implemented with a memory device including a volatile memory or a nonvolatile memory.

For example, in the case where the memory device 10000 is a volatile memory, the memory device 10000 may include a dynamic random access memory (DRAM), a static RAM (SRAM), a thyristor RAM (TRAM), a zero capacitor RAM (Z-RAM), a twin transistor RAM (TTRAM), etc.

For example, in the case where the memory device 10000 is a nonvolatile memory, the memory device 10000 may be an electrically erasable programmable read-only memory (EEPROM), a flash memory, a magnetoresistive RAM (MRAM), a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM (RRAM), a polymer RAM (PoRAM), a nano-floating gate memory (NFGM), a holographic memory, a molecular electronic memory device, an insulator resistance change memory, etc.

The memory device 10000 may include a termination resistance calibration circuit 11000, a mode register 12000, an output buffer circuit 13000, a memory cell array 14000, a sense amplifier 14100, a row decoder 14200, a column decoder 14300, a command/address latch 15000, an input buffer circuit 16000, and a command decoder 17000.

The termination resistance calibration circuit 11000 may perform a calibration operation for matching between a termination resistance value and a target resistance value. Through the calibration operation, the termination resistance calibration circuit 11000 may generate the pull up and pull down resistance calibration codes ZQ_P and ZQ_N. The pull up and pull down resistance calibration codes ZQ_P and ZQ_N are provided to the output buffer circuit 13000. An output resistance value of the output buffer circuit 13000 may be matched with the target resistance value by the pull up and pull down resistance calibration codes ZQ_P and ZQ_N.

The mode register 12000 may receive and store a command for controlling the emphasis operation of the output buffer circuit 13000 from the command decoder 17000. The mode register 12000 may provide the output buffer circuit 13000 with the emphasis control signal EMP_en and the strength adjustment signal EMP_st that are stored through the above-described command.

The output buffer circuit 13000 may output data stored in the memory cell array 14000 through an input/output pad DQ to the outside of the memory device 10000. Data stored in the memory cell array 14000 may be provided to the output buffer circuit 13000 through the sense amplifier 14100. To this end, memory cells of the memory cell array 14000, in which data to be output are stored, may be selected by the row decoder 14200 and the column decoder 14300 that are provided with the address ADDR.

The output buffer circuit 13000 may perform the pre-emphasis operation, which is described with reference to FIGS. 1 to 7, 8A to 8C, and 9 to 12, based on the pull up and pull down resistance calibration codes ZQ_P and ZQ_N, the emphasis control signal EMP_en, and the strength adjustment signal EMP_st. Alternatively, the output buffer circuit 13000 may perform the de-emphasis operation, which is described with reference to FIGS. 1 and 13 to 17, based on the provided codes and signals.

The command/address latch 15000 receives a command CMD and an address ADDR from a host or a memory controller (not illustrated). The command/address latch 15000 provides the received command CMD to the command decoder 17000. Also, the command/address latch 15000 provides the received address ADDR to the row decoder 14200 and the column decoder 14300.

Data provided from the outside of the memory device 10000 may be provided to the input buffer circuit 16000 through the input/output pad DQ. In this case, the output buffer circuit 13000 may operate as an on-die termination circuit. The data provided to the input buffer circuit 16000 may be stored in the memory cell array 14000 through the sense amplifier 14100. An address ADDR for selecting memory cells of the memory cell array 14000, in which data provided from the outside of the memory device 10000 are to be stored, may be provided to the command/address latch 15000, the row decoder 14200, and the column decoder 14300.

The command decoder 17000 is provided with various commands through the command/address latch 15000. The command decoder 17000 provides the command CMD to elements such as the row decoder 14200, the column decoder 14300, and the termination resistance calibration circuit 11000.

According to exemplary embodiments, an output buffer circuit and a memory device may not include a separate main driver for implementing an emphasis operation. Accordingly, it may be possible to reduce a size of the output circuit and prevent an increase in parasitic capacitance of an output terminal thereof and simultaneously, to implement pre-emphasis or de-emphasis for compensating for ISI of a data signal transmitted. This may mean that the quality of an output data signal is improved.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. An output buffer circuit comprising:
a pulse generator configured to generate a pulse signal for determining an emphasis execution period;
a transmitter configured to have a first output resistance value, which is determined by input data and a resistance calibration code, and to have a second output resistance value different from the first output resistance value, which is determined by the input data and an emphasis code different from the resistance calibration code for executing an emphasis operation during the emphasis execution period based on the pulse signal; and
an emphasis controller configured to provide the resistance calibration code or the emphasis code to the transmitter based on the pulse signal.

2. The output buffer circuit of claim 1, wherein the transmitter comprises:
a first pre-driver configured to generate a first driving signal for providing the first output resistance value or the first driving signal for providing the second output resistance value, based on the pulse signal; and
a first main driver configured to provide the first output resistance value or the second output resistance value in response to the first driving signal.

3. The output buffer circuit of claim 2, wherein the transmitter further comprises:
a second pre-driver configured to, when a strength adjustment signal is activated, generate a second driving signal for providing the first output resistance value or the second driving signal for providing the second output resistance value in response to the pulse signal, wherein the second pre-driver configured to, when the strength adjustment signal is deactivated, generate the second driving signal for providing the first output resistance value regardless of the pulse signal; and
a second main driver configured to provide the first output resistance value or the second output resistance value in response to the second driving signal.

4. The output buffer circuit of claim 3, further comprising:
an emphasis strength controller configured to:
when the strength adjustment signal is activated, provide the resistance calibration code or the emphasis code to the second pre-driver in response to the pulse signal such that the second pre-driver and the second main driver perform the emphasis operation; and
when the strength adjustment signal is deactivated, provide the resistance calibration code to the second pre-driver regardless of the pulse signal.

5. The output buffer circuit of claim 1, wherein the emphasis controller is configured to provide the emphasis code to the transmitter for determining the second output resistance value, which is smaller than the first output resistance value.

6. The output buffer circuit of claim 5, wherein the emphasis execution period that is determined by an enable period of the pulse signal comprises a period in which an output signal of the transmitter transitions.

7. The output buffer circuit of claim 5, further comprising:
an emphasis strength controller configured to control the transmitter in response to a strength adjustment signal so as to provide a third output resistance value smaller than the second output resistance value.

8. The output buffer circuit of claim 1, wherein the emphasis controller is configured to provide the emphasis code to the transmitter for determining the second output resistance value, which is larger than the first output resistance value.

9. The output buffer circuit of claim 8, wherein the emphasis execution period that is determined by a disable period of the pulse signal comprises a period in which an output signal of the transmitter maintains a predetermined voltage level.

10. The output buffer circuit of claim 8, further comprising:
an emphasis strength controller configured to control the transmitter in response to a strength adjustment signal so as to provide a third output resistance value larger than the second output resistance value.

11. A memory device comprising:
a memory cell array including a plurality of memory cells;
a code generation circuit configured to generate a resistance calibration code for determining an output resistance value; and
an output buffer circuit comprising a main driver configured to output a data output signal based on an input data read from the memory cell array,
wherein the main driver is configured to receive the resistance calibration code, to provide a first output resistance value determined by the resistance calibration code upon the input data, and to provide a second output resistance value determined by an emphasis code different from the resistance calibration code for performing an emphasis operation in an emphasis execution period upon the input data.

12. The memory device of claim 11, wherein the emphasis execution period comprises a period in which the data output signal of the output buffer circuit transitions, and
wherein the second output resistance value is smaller than the first output resistance value.

13. The memory device of claim 11, wherein the emphasis execution period comprises a period in which the data output signal of the output buffer circuit maintains a predetermined voltage level, and
wherein the second output resistance value is larger than the first output resistance value.

14. The memory device of claim 11, wherein the output buffer circuit is configured to determine whether to perform the emphasis operation in response to an emphasis control signal.

15. The memory device of claim 14, further comprising:
a mode register configured to store the emphasis control signal and to provide the emphasis control signal to the output buffer circuit.

16. A memory device comprising:
a memory cell array including a plurality of memory cells;
a termination resistance calibration circuit configured to generate a resistance calibration code for determining an output resistance value; and
an output buffer circuit including a pre-driver and a main driver, and configured to receive an input data read from the memory cell array and output an output data,
wherein the pre-driver is configured to:
generate a first driving signal code in response to the input data regardless of the resistance calibration code, and
generate a second driving signal code in response to the input data and the resistance calibration code,
wherein the main driver is configured to output the output data to have a first output resistance value in response to the first driving signal code, and have a second output resistance value different from the first output resistance value in response to the second driving signal code.

17. The memory device of claim 16, wherein the first output resistance value is greater or smaller than the second output resistance value.

18. The memory device of claim 17, wherein the main driver comprises:
a pull up driver including a first PMOS transistor and a second set of PMOS transistors, and a pull down driver including a first NMOS transistor and a second set of NMOS transistors,
wherein the first PMOS transistor or the first NMOS transistor is activated in response to a first signal code of each of the first and second driving signal codes, and
wherein the memory device is configured such that:
when the main driver has the first output resistance value smaller than the second output resistance value, a number of the second set of PMOS or NMOS transistors that are activated in response to the first driving signal code is respectively greater than a number of the second set of PMOS or NMOS transistors that are activated in response to the second driving signal code, and
when the main driver has the first output resistance value greater than the second output resistance value, a number of the second set of PMOS or NMOS transistors that are activated in response to the first driving signal code is respectively smaller than a number of the second set of PMOS or NMOS transistors that are activated in response to the second driving signal code.

19. The memory device of claim 18, wherein the memory device is configured such that when the main driver has the first output resistance value smaller than the second output resistance value, all of the first PMOS transistor and the second set of PMOS transistors or all of the first NMOS transistor and the second set of NMOS transistors are activated based on the input data.

20. The memory device of claim 16, wherein the pre-driver is configured to generate the first driving signal code in response to further an emphasis pulse signal, and further comprising:
a pulse generator configured to generate the emphasis pulse signal including a first or second pulse each having an enabled period of time and a disabled period of time based on the input data,
wherein the main driver has the first output resistance value smaller than the second output resistance value during the enabled period of time of the first or second pulse, or
wherein the main driver has the first output resistance value greater than the second output resistance value during the disabled period of time of the first or second pulse.

* * * * *